(12) United States Patent
Aljohani et al.

(10) Patent No.: US 11,320,467 B1
(45) Date of Patent: May 3, 2022

(54) PROGRAMMABLE HIGH-FREQUENCY POLY PHASE SMART METER FOR POWER ANALYTICS

(71) Applicant: King Abdulaziz University, Jeddah (SA)

(72) Inventors: Abdulah Jeza Aljohani, Jeddah (SA); Abdolmaged Alkhulaifi, Jeddah (SA)

(73) Assignee: King Abdulaziz University, Jeddah (SA)

( * ) Notice: Subject to any disclaimer, the term of this patent is extended or adjusted under 35 U.S.C. 154(b) by 0 days.

(21) Appl. No.: 17/411,508

(22) Filed: Aug. 25, 2021

(51) Int. Cl.
*G01R 19/25* (2006.01)
*G01R 21/133* (2006.01)
*G01R 22/10* (2006.01)

(52) U.S. Cl.
CPC ..... *G01R 19/2513* (2013.01); *G01R 19/2509* (2013.01); *G01R 21/133* (2013.01); *G01R 22/10* (2013.01)

(58) Field of Classification Search
CPC ............ G01R 19/2509; G01R 19/2513; G01R 21/133; G01R 22/10
USPC ......................................................... 702/60
See application file for complete search history.

(56) References Cited

U.S. PATENT DOCUMENTS

| | | | | |
|---|---|---|---|---|
| 5,701,253 A | * | 12/1997 | Mayell | G01R 19/0092 324/142 |
| 6,112,159 A | * | 8/2000 | Bond | G01R 21/1333 702/61 |
| 2006/0271314 A1 | | 11/2006 | Hayes | |
| 2012/0278014 A1 | | 11/2012 | Davies | |
| 2014/0321304 A1 | * | 10/2014 | Yu | H04W 52/367 370/252 |

FOREIGN PATENT DOCUMENTS

CN 207832893 U 9/2018

OTHER PUBLICATIONS

Analog Devices, ADE7754, Polyphase Multifunction Energy Metering IC with Serial Port (Year: 2003).*
Jonetzko, et al. ; Development of a Real-Time Smart Meter for Non-Intrusive Load Monitoring and Appliance Disaggregation ; Adjunct Proceedings of the $29^{th}$ EnviroInfo and $3^{rd}$ ICT4s Conference ; Sep. 7-9, 2015 ; 6 Pages.

* cited by examiner

*Primary Examiner* — John H Le
(74) *Attorney, Agent, or Firm* — Oblon, McClelland, Maier & Neustadt, L.L.P.

(57) ABSTRACT

Methods and systems for controlling power supplied to a plurality of appliances on a power line. Poly phase power measurements are collected from the power line by a dedicated energy metering chip are sampled at frequencies in the range of 0 kilo samples per second to 32 kilo samples per second and converted to digital power measurements. The digital power measurements are received by a real-time microcontroller. The poly phase power measurements are analyzed in real time, the poly phase power measurements are disaggregated, and a power report regarding a power usage of each appliance is generated by a computer processing unit, CPU. A power report is transmitted to a mobile application, power on/off commands for each appliance are received from the mobile application, and each appliance is powered on/off based on the power on/off commands.

17 Claims, 22 Drawing Sheets

PROGRAMMABLE HIGH-FREQUENCY POLY PHASE SMART METER FOR POWER ANALYTICS

BACKGROUND

Technical Field

The present disclosure is directed to a poly phase smart meter for collecting various power measurements at high frequencies and performing various operations and analytics on the power measurements.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Smart electrical meters are devices that measure various characteristics of a power line, process and analyze the measured characteristics to derive insights, and display the insights to a user or transmit the insights to a remote computer server via a communication network. The measured characteristics may be used to inform users of their power consumption, monitor the quality of the power line, and perform advanced analysis to disaggregate the power consumption into per electrical load level. The smart electrical meters may include embedded computing device(s) to process and analyze the measured characteristics.

To process or analyze the measured characteristics, for example, power measurements such as voltage and current, an analog-to-digital converter (ADC) may be required to convert analog input, i.e., the current and voltage measurements into digital values. The digital values may then be processed and analyzed. Some smart meters may include a microcontroller programmed for analog-to-digital conversion of current and voltage measurements and processing or analyzing the digital values. The process for such smart meters may be very complex to perform and may lead to less accurate digital values. Other smart meters may use a third-party dedicated energy metering chip which may communicate with a microcontroller via a serial interface. Using the dedicated energy metering chip may result in highly accurate digital values and the microcontroller may collect the digital values. However, it may be difficult for the microcontroller to perform further analysis on the collected digital values as the microcontroller may not be powerful enough to collect, process, and analyze the digital values at the same time, thus, affecting real-time analysis of the characteristics of the power line. Further, the microcontroller may not be powerful enough to perform advanced analysis algorithms to disaggregate the power consumption into per electrical load level.

To perform real-time analysis and advanced analysis algorithm, it may be required to collect and sample the power measurements at a certain frequency. Further, the power line may have multiple phases, such as a 3-phase power line, and collecting and sampling power measurements for each of the multiple phases may be difficult. The dedicated energy metering chip may facilitate in collecting and sampling the power measurements, however, it may be complex to work and interact with the dedicated energy metering chip using a high-level programming language. Also, collecting and sampling power measurements at a high rate while also performing analysis requires high processing speed. The smart meters may send the digital power measurements to cloud servers for analysis instead of processing the measurements on-device in real-time. However, such a practice may raise privacy concerns as these insights may characterize the facility occupant's behavior.

Various solutions have been developed in recent years to provide smart meters that may measure various characteristics of a power line and process and analyze the measured characteristics. One such system includes a power signature identification unit that monitors the power usage at a sampling frequency of 50 kHz, and the power signature is derived from power consumption measurements and load characteristics taken by the power signature identification unit or from real-time data information taken from a smart meter. (See: U.S. Pat. No. 9,250,101B2, "Method and apparatus for monitoring power consumption", incorporated herein by reference in its entirety). However, this reference does not disclose necessary hardware and/or software modules for separately receiving and analyzing power measurements of a poly-phase electrical supply line.

A wireless electrical power metering system has been described which measures power consumption information on a power line, converts the power consumption information into IP-based data, and transmits the IP-based data to a remote monitoring station or across the Internet for storage, analysis, and billing. (See: US20060271314A1, "Electrical power metering system", incorporated herein by reference in its entirety). However, this reference does not disclose collecting and sampling power measurements of the power line at high frequencies or high sampling rates.

Each of the aforementioned references suffers from one or more drawbacks such as receiving power measurements from all three phases of a poly phase electrical power supply line, failing to collect and sample power measurements at high frequencies, and failing to analyze the power measurements in real-time, thus hindering their adoption.

Accordingly, it is one object of the present disclosure to provide methods and systems for collecting power measurements from a poly phase electrical power supply line, sampling the collected power measurements at high frequencies, and analysing digital power measurements in real-time.

SUMMARY

In an exemplary embodiment, a method for controlling power by a high frequency programmable poly phase smart meter of a plurality of appliances on a power line is disclosed. The method includes collecting, by a dedicated energy metering chip, poly phase power measurements from the power line; sampling, by an analog to digital converter, the poly phase power measurements at frequencies in the range of 0 kilo samples per second to 32 kilo samples per second and converting the poly phase power measurements to digital power measurements; transmitting, by a serial port interface, SPI, the digital power measurements over a serial communications interface; receiving, by a real-time microcontroller, the digital power measurements from the SPI; storing, in a memory, the digital power measurements; accessing, by a computer processing unit, CPU, the digital power measurements from the memory; analyzing, by the CPU, the CPU including circuitry and one or more processors having program instructions, the poly phase power measurements in real time, disaggregating the poly phase power measurements, and generating a power report regarding a power usage of each appliance; and transmitting, by a communications unit, the power report.

In another exemplary embodiment, a high frequency programmable poly phase smart meter for a plurality of appliances is disclosed. The high frequency programmable poly phase smart meter includes a set of clamps configured to surround a power line which supplies power to the plurality of appliances; a dedicated energy metering chip connected to receive power from the set of clamps and collect poly phase power measurements from the power line. The dedicated energy metering chip includes an analog to digital converter, ADC, the ADC configured to sample the poly phase power measurements at frequencies in the range of 0 kilo samples per second to 32 kilo samples per second and convert the poly phase power measurements to digital power measurements; and a serial interface configured to connect the dedicated energy metering chip with a dual processor. The dual processor includes a real-time microcontroller connected to the dedicated energy metering chip via the serial interface to receive the digital power measurements; a computer processing unit, CPU, connected to the real-time microcontroller, the CPU including circuitry and one or more processors having program instructions configured to analyze the poly phase power measurements in real time, disaggregate the poly phase power measurements, and generate a power report regarding a power usage of each appliance; and a memory shared by the real-time microcontroller and the CPU. The high frequency programmable poly phase smart meter further includes a communications unit connected to the real-time microcontroller, wherein the communications unit is configured to transmit the power report.

In another exemplary embodiment, a system for controlling power supplied to a plurality of appliances on a power line is disclosed. The system for controlling power supplied to a plurality of appliances on a power line includes a dedicated energy metering chip configured to collect poly phase power measurements from the power line. The dedicated energy metering chip includes an analog to digital converter, ADC, the ADC configured to sample the poly phase power measurements at frequencies in the range of 0 kilo samples per second to 32 kilo samples per second and convert the poly phase power measurements to digital power measurements; and a serial interface to connect the dedicated energy metering chip with a dual processor, the serial interface configured to transmit the poly phase measurements. The dual processor includes a real-time microcontroller connected to the dedicated energy metering chip via the serial interface to receive the digital power measurements; a computer processing unit, CPU, connected to the real-time microcontroller, the CPU including circuitry and one or more processors having program instructions configured to analyze the poly phase power measurements in real time, disaggregate the poly phase power measurements, and generate a power report regarding a power usage of each appliance; and a memory shared by the real-time microcontroller and the CPU, the memory configured to store the digital power measurements. The system for controlling power supplied to a plurality of appliances on a power line further includes a mobile application registered with the high frequency programmable poly phase smart meter; and a communications unit connected to the real-time microcontroller, the communications unit configured to transmit the power report to the mobile application, receive power on/off commands for each appliance from the mobile application and power each appliance on/off based on the power on/off commands.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
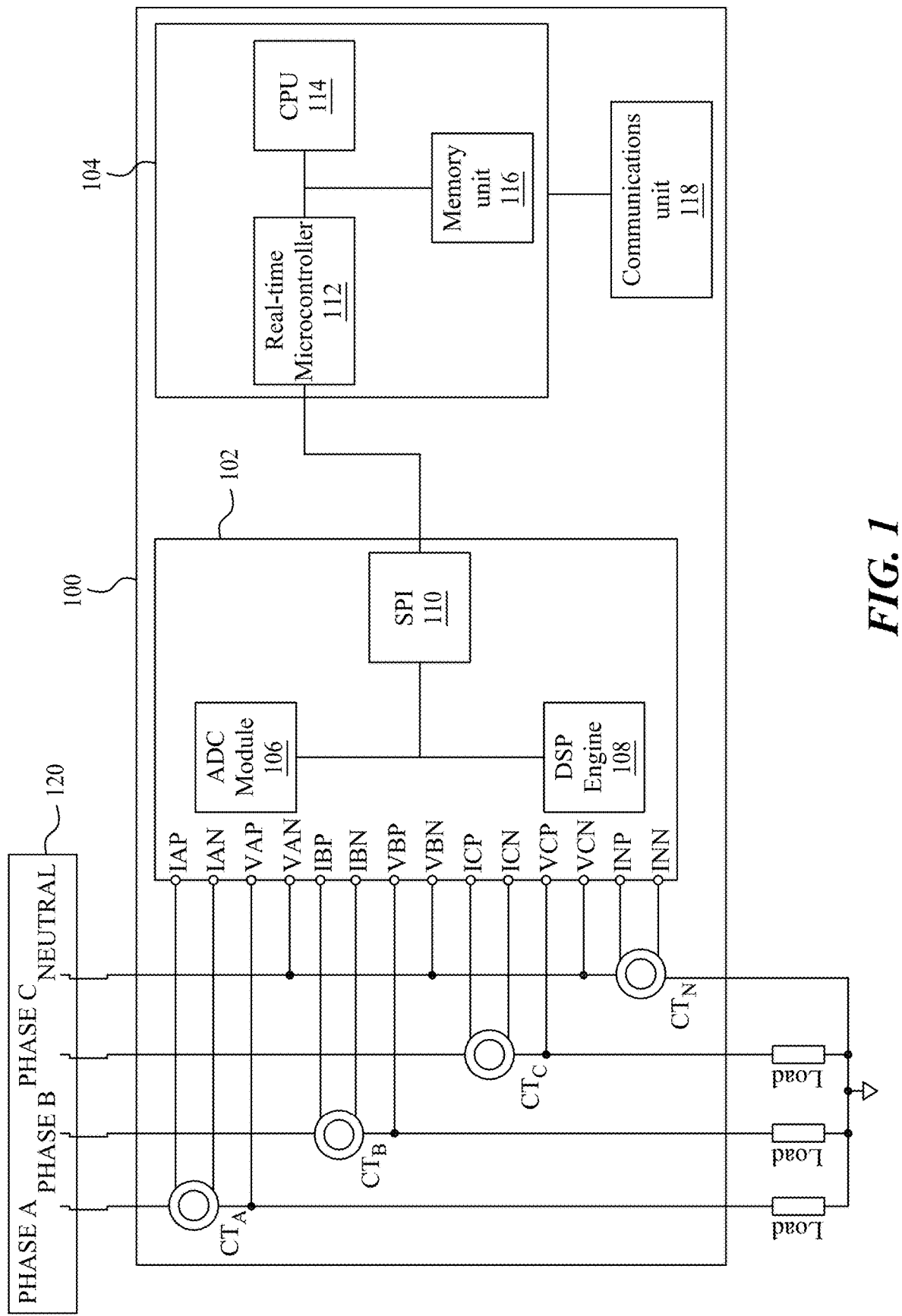
FIG. 1 is a schematic diagram of a poly phase smart meter, according to exemplary aspects of the present disclosure.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Aspects of this disclosure are directed to a system, device, and method for controlling power by a poly phase smart meter of a plurality of electrical loads on a poly phase electrical power supply line. The present disclosure collects power measurements from the poly phase electrical power supply line using a dedicated energy metering chip and converts the power measurements to digital power measurements. The digital power measurements are received by a real-time microcontroller. The present disclosure analyzes the digital power measurements in real-time, disaggregates the digital power measurements, and a computer processing unit (CPU) generates a power report regarding power usage of each of the plurality of electrical loads connected to the poly phase electrical power supply line.

FIG. 1 depicts a schematic diagram of a poly phase smart meter 100, according to exemplary aspects of the present disclosure.

According to aspects of the present disclosure, the poly phase smart meter 100 (also referred to as the high frequency programmable poly phase smart meter) may include a dedicated energy metering chip 102 and a dual-processor board 104. The dedicated energy metering chip 102 may include an analog-to-digital converter (ADC) module 106, a digital signal processing (DSP) engine 108, and a serial port interface (SPI) 110. The dual-processor board 104 may include a real-time microcontroller 112, a computer processing unit (CPU) 114, and a memory unit 116. The poly phase smart meter 100 may further include a communications unit 118.

A poly phase electrical power supply line 120 may be a 3-phase electrical power supply line including PHASE A, PHASE B, PHASE C, and NEUTRAL power lines. The poly phase electrical power supply line 120 may supply electrical power to a facility, such as a household, a commercial facility, and an industrial facility. The poly phase smart meter 100 may determine the power consumption of the facility, monitor the quality of the poly phase electrical power supply line 120, and perform advanced analysis on various electrical power measurements collected from the poly phase electrical power supply line 120.

The dedicated energy metering chip 102 may be a poly phase energy and power quality measurement integrated circuit. The dedicated energy metering chip 102 may provide complete power monitoring capabilities with high accuracy over a wide dynamic range. The dedicated energy metering chip 102 may collect power measurements, such as current and voltage measurements of the poly phase electrical power supply line 120 via electrical connections between the poly phase electrical power supply line 120 and the dedicated energy metering chip 102. The poly phase smart meter 100 may include current transformer (CT) clamps, $CT_A$, $CT_B$, $CT_C$, and $CT_N$ to measure current of the poly phase electrical power supply line 120. The dedicated energy metering chip 102 may collect and sample the power measurements of the poly phase electrical power supply line 120 over a wide range of sampling rate. In an aspect of the present disclosure, the dedicated energy metering chip 102 may sample the power measurements in a range of 0 kilo samples per second (ksps) to 32 ksps.

The dedicated energy metering chip 102 includes the ADC module 106. The ADC module 106 performs sampling of the collected power measurements and converts the collected power measurements of the poly phase electrical power supply line 120 to digital data format.

The dedicated energy metering chip 102 includes the DSP engine 108. The DSP engine 108 uses the sampled power measurements to determine one or more power parameters of the poly phase electrical power supply line 120. The one or more power parameters of the poly phase electrical power supply line 120 may include, but are not limited to, total and fundamental measurements on root mean square (RMS) power, active power, reactive power, and apparent power, voltage RMS, current RMS, voltage total harmonic distortion (VTHD), current total harmonic distortion (ITHD), power factor, phase angle, peak voltage, peak current, voltage dip, voltage swell, phase sequence, and watthour.

The dedicated energy metering chip 102 includes the SPI 110. The SPI 110 may provide a communication interface between the dedicated energy metering chip 102 and the dual-processor board 104. In an aspect of the present disclosure, the SPI 110 may be a high-speed communication port, for example, a 20 MHz serial port interface. The SPI 110 transmits the one or more power parameters to the real-time microcontroller 112.

In a non-limiting example, the dedicated energy metering chip 102 may be a poly phase energy and power quality measurement integrated circuit, such as the ADE9000 from Analog Devices, Inc.

The real-time microcontroller 112 receives the one or more power parameters over the SPI 110. The real-time microcontroller 112 stores the one or more power parameters in the memory unit 116. In an aspect of the present disclosure, the real-time microcontroller 112 may include a general purpose input output (GPIO) interface, one or more programmable real-time units (PRUs), a buffer, and a media-independent interface (MII). The real-time microcontroller 112 may be any other suitable processing device such as a microprocessor, or a processor. In a non-limiting example, the real-time microcontroller 112 may be a PRU industrial communication subsystem (PRU-ICSS).

The CPU 114 accesses the memory unit 116 to analyze the one or more power parameters. The CPU 114 is programmed to execute one or more power analytics algorithms that analyze the one or more power parameters to determine power consumption of the facility, monitor the quality of the poly phase electrical power supply line 120, and perform advanced analysis to disaggregate the power consumption into per electrical load level at the facility. In an aspect of the present disclosure, determining the power consumption, monitoring the quality of the poly phase electrical power supply line 120, and performing advanced analysis to disaggregate the power consumption is performed in real-time.

The CPU 114 may be implemented as one or more microprocessors, microcomputers, microcontrollers, digital signal processors, central processing units, graphical processing units, state machines, logic circuitries, and/or any devices that manipulate signals based on operational instructions. Among other capabilities, the CPU 114 may be configured to fetch and execute computer-readable instructions stored in the memory unit 116. In an aspect of the present disclosure, the memory unit 116 may include any computer-readable medium known in the art including, for example, volatile memory, such as static random access memory (SRAM) and dynamic random access memory (DRAM) and/or nonvolatile memory, such as read-only memory (ROM), erasable programmable ROM, flash memories, hard disks, optical disks, and magnetic tapes. The memory unit 116 may be capable of storing data and allowing any storage location to be directly accessed by the real-time microcontroller 112 and the CPU 114.

In operation, the dedicated energy metering chip 102 collects the power measurements, such as the voltage and current measurements of the poly phase electrical power supply line 120 and samples the power measurements over a wide range of sampling rate. The dedicated energy metering chip 102 may sample the voltage and current measurements in the range of 0-32 ksps. In an aspect of the present disclosure, for the poly phase smart meter 100 to perform real-time analysis, the dedicated energy metering chip 102 may sample the voltage and current measurements at high sampling rates, such as 8 ksps or 32 ksps.

The poly phase smart meter 100 may include voltage sensing circuitry and current sensing circuitry for each phase of the poly phase electrical power supply line 120. The voltage sensing circuitry and the current sensing circuitry senses the voltage and current, respectively, for each phase of the poly phase electrical power supply line 120. The dedicated energy metering chip 102 collects the voltage and current measurements from the voltage sensing circuitry and the current sensing circuitry, respectively. The voltage sensing circuitry and the current sensing circuitry are explained in further detail with reference to FIGS. 2A and 2B.

The ADC module 106 receives the output of the voltage sensing circuitry and the current sensing circuitry for each phase as the voltage measurement and the current measurement, respectively. In an aspect of the present disclosure, the ADC module 106 may include an analog-to-digital converter (ADC) corresponding to the voltage sensing circuitry and the current sensing circuitry for each phase of the poly phase electrical power supply line 120. The ADC module 106 samples the received voltage and current measurements over a wide range of sampling rates. In an aspect of the present disclosure, the ADC module 106 may sample the received voltage and current measurements in the range of 0-32 ksps. In an aspect of the present disclosure, for the poly phase smart meter 100 to perform real-time analysis, the ADC module 106 may sample the voltage and current measurements at high sampling rates ranging from 8 ksps to 32 ksps.

The dedicated energy metering chip 102 may include registers to store the sampled voltage and current measurements for each phase of the poly phase electrical power supply line 120. The registers may be updated at a rate ranging from 0 ksps to 32 ksps. In an aspect of the present disclosure, for the poly phase smart meter 100 to perform real-time analysis, the registers may be updated at high update rates, ranging from 8 ksps to 32 ksps.

The ADC module 106 outputs the sampled voltage and current measurements to the DSP engine 108. The DSP engine 108 processes the sampled voltage and current measurements using one or more algorithms to determine the one or more power parameters.

The SPI 110 provides a communication interface between the dedicated energy metering chip 102 and the dual-processor board 104. The SPI 110 provides a serial communications interface to transmit the one or more power parameters determined by the DSP engine 108 to the real-time microcontroller 112.

In an aspect of the present disclosure, the dedicated energy metering chip 102 may include a buffer memory. The buffer memory may store the sampled voltage and current measurements from the ADC module 106. The sampled voltage and current measurements stored in the buffer memory are transmitted to the real-time microcontroller 112 by the SPI 110.

The dual-processor board 104 includes the real-time microcontroller 112, the CPU 114, and the memory unit 116. The real-time microcontroller 112 receives the digital power measurements from the dedicated energy metering chip 102 over the serial communications interface established by the SPI 110. The digital power measurements may include the one or more power parameters determined by the DSP engine 108 and/or the sampled voltage and current measurements stored in the buffer memory. In an aspect of the present disclosure, the real-time microcontroller 112 may be configured to receive data at high frequencies. To perform real-time analysis of the power measurements of the poly phase electrical power supply line 120, the real-time microcontroller 112 may be configured to receive the digital power measurements generated by sampling the voltage and current measurements at high sampling rates ranging from 8 ksps to 32 ksps. The real-time microcontroller 112 may store the received digital power measurements in the memory unit 116.

The CPU 114 accesses the digital power measurements from the memory unit 116. The CPU 114 may execute one or more power analytics algorithm on the digital power measurements to perform real-time analysis of the power measurements of the poly phase electrical power supply line 120. The CPU 114 may execute one or more power analytics algorithm on the digital power measurements to determine the power consumption of the facility in real-time, monitor the quality of the poly phase electrical power supply line 120 in real-time, and perform advanced analysis to disaggregate the power consumption into per electrical load level of the facility in real-time.

The facility includes the plurality of electrical loads connected to the poly phase electrical power supply line 120. The plurality of electrical loads may be distributed across the multiple phases of the poly phase electrical power supply line 120. For example, the phase A may include one or more of the plurality of electrical loads, the phase B may include one or more of the plurality of electrical loads, and the phase C may include one or more of the plurality of electrical loads. The electrical loads may include various power consuming electrical devices, such as electrical plugs, lights, fans, and home appliances such as an air conditioner, a refrigerator, kitchen appliances, a television, a washing machine, and a dishwasher. The CPU 114 may perform advanced analysis to determine real-time disaggregated power consumption of the electrical loads distributed across the multiple phases of the poly phase electrical power supply line 120. Power or energy disaggregation may correspond to breaking down aggregate power consumption of the facility into the power consumption at the per electrical load level.

The CPU 114 may generate a power report. The power report may include one or more of: a) total or aggregated power consumption of the facility, b) disaggregated power consumption of the facility, i.e., power consumption of each of the plurality of electrical loads at the facility, and c) parameters indicating quality of the poly phase electrical power supply line 120. In an aspect of the present disclosure, the power report may include values and/or graphically represent the aggregated and disaggregated power consumption of the facility.

The real-time microcontroller 112 may receive the sampled voltage and/or current measurements which are sampled at high sampling rates ranging from 8 ksps to 32 ksps. The CPU may apply a Fast Fourier Transformation (FFT) to the sampled voltage and/or current measurements. Sampling the voltage and/or current measurements at such high sampling rates and the CPU 114 applying the FFT permits the CPU 114 to perform one or more non-intrusive load monitoring (NILM) algorithms. The one or more NILM algorithms perform power disaggregation, i.e., the estimation of power consumption at per electrical load level from the aggregate power consumption of the facility. In an aspect of the present disclosure, the VTHD and ITHD, determined by the dedicated energy metering chip 102 by sampling the voltage and current measurements at high sampling rates, may be used by the CPU 114 to perform the one or more NILM algorithms for power disaggregation.

Thus, the high frequency or sampling rate of the power measurements supports performing artificial intelligence (AI) aided techniques such as the one or more NILM algorithms and performing real-time power disaggregation on the poly phase smart meter 100 itself.

Each electrical load may produce a unique power consumption pattern that may be identified in the total power consumption. With enough data from the different electrical loads and usage patterns, a machine-learning algorithm may be trained to detect the power consumption pattern of the electrical loads from the aggregate power consumption.

Figure 7A:
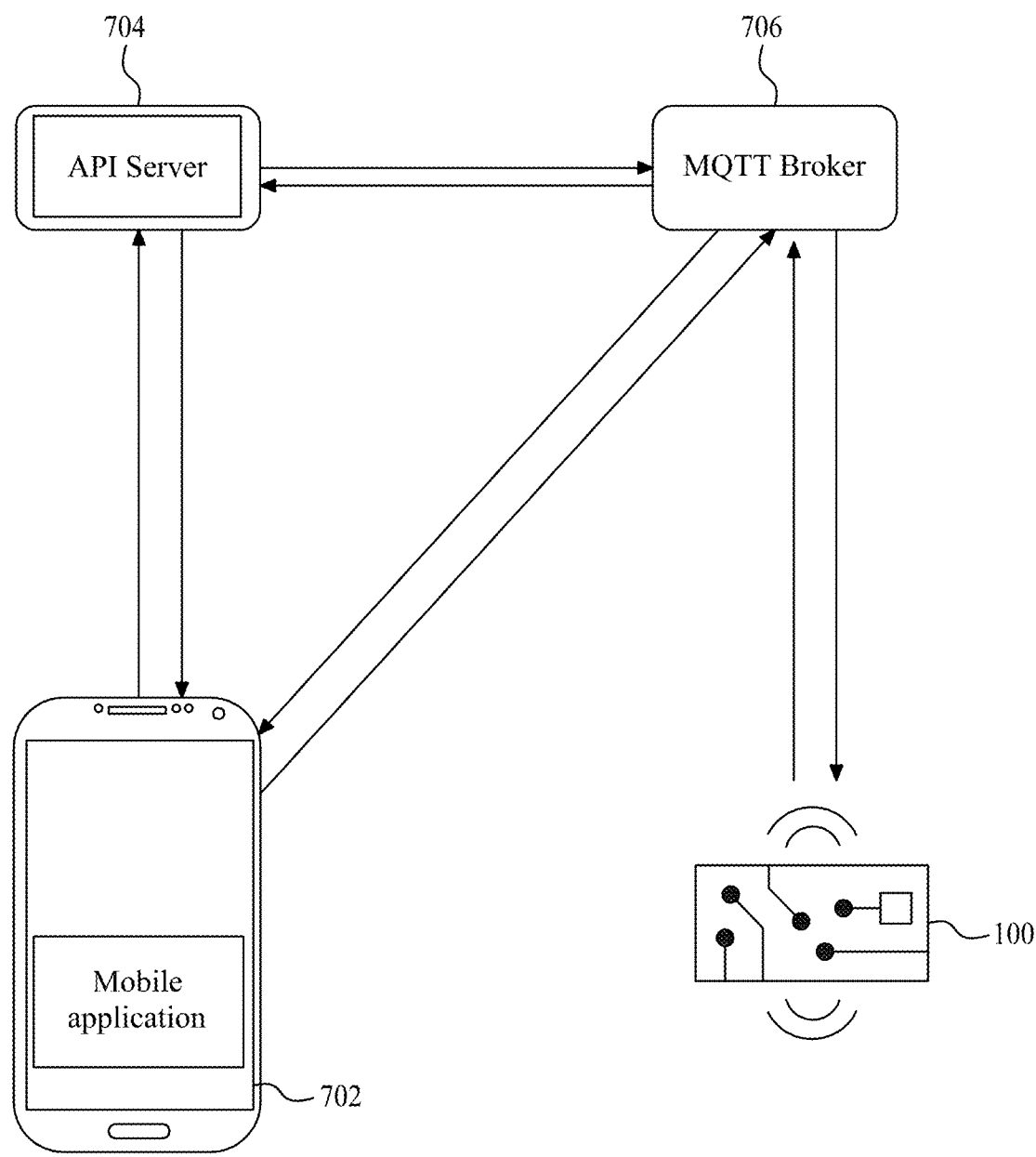
FIG. 7A is an illustration of secure message queuing telemetry transport (MQTT) communication established between a mobile application and a poly phase smart meter, according to exemplary aspects of the present disclosure.

In some aspects of the present disclosure, the communications unit 118 may establish communication between the poly phase smart meter 100 and a user computing device over a network (See FIG. 7A). The user computing device may include, but is not limited to, smart phones, tablets, personal digital assistants (PDAs), laptops, and desktop computers. The communications unit 118 may transmit results of the real-time analysis of the power measurements of the poly phase electrical power supply line 120 to the user computing device. In an aspect of the present disclosure, the communications unit 118 may transmit real-time power consumption of the facility, real-time quality of the poly phase electrical power supply line 120, and real-time disaggregated power consumption of each electrical load at the facility to the user computing device.

The dedicated energy metering chip 102 generates digital power measurements at high frequencies or sampling rates ranging from 8 ksps to 32 ksps. The dedicated microcontroller, i.e., the real-time microcontroller 112 that is configured to receive the digital power measurements generated at such high frequencies or sampling rates and a dedicated processor, i.e., the CPU 114 that is configured to perform analysis on the digital power measurements generated at such high frequencies facilitates the real-time analysis of the power measurements of the poly phase electrical power supply line 120.

In an aspect of the present disclosure, the digital power measurements may be stored with corresponding timestamps of the measurement in the memory unit 116. The CPU 114 may execute one or more power analytics algorithms to analyze the digital power measurements over a specified period of time.

The CPU 114 may be configured to determine the one or more power parameters. The CPU 114 may be programmed to execute the one or more algorithms to determine the one or more power parameters using the sampled voltage and current measurements. The CPU 114 may perform real-time analysis of the power measurements of the poly phase electrical power supply line 120 using the one or more power parameters, the sampled voltage and current measurements, or both.

Figure 3:
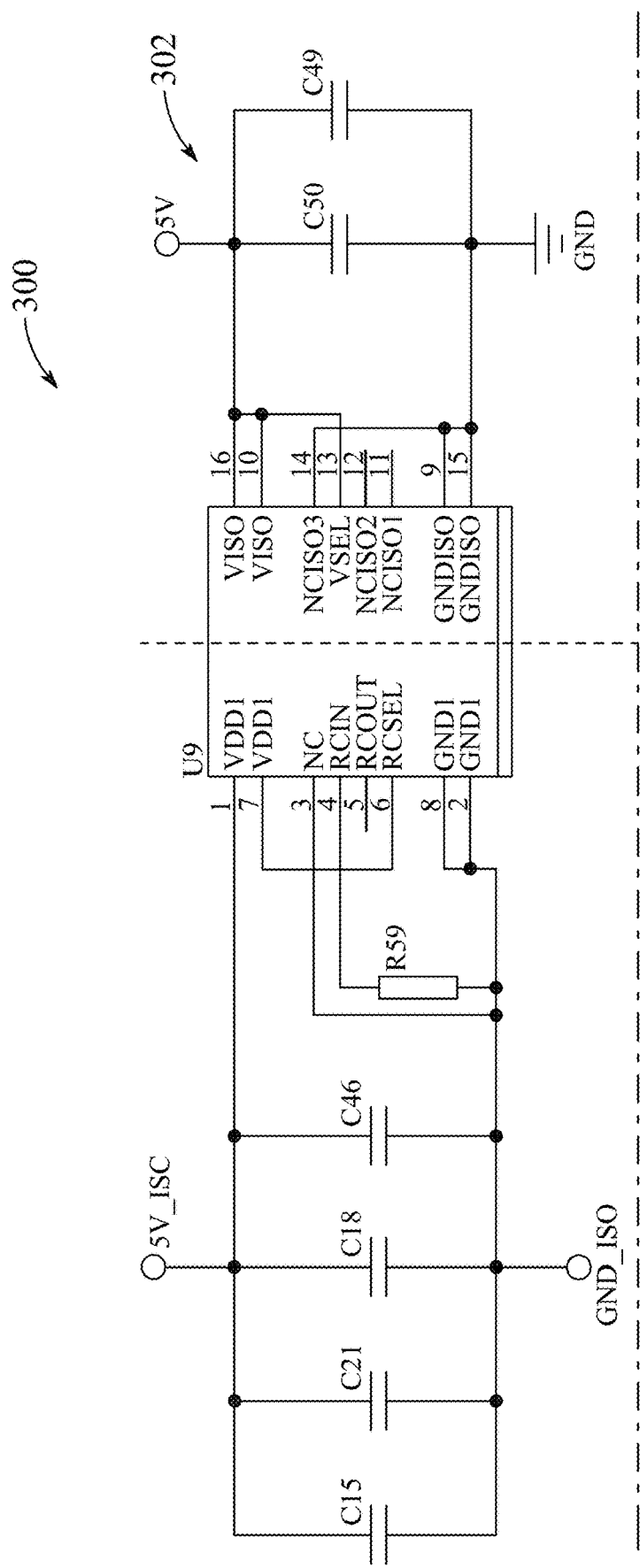
FIG. 3 is an isolation circuitry, according to exemplary aspects of the present disclosure.
Figure 3:
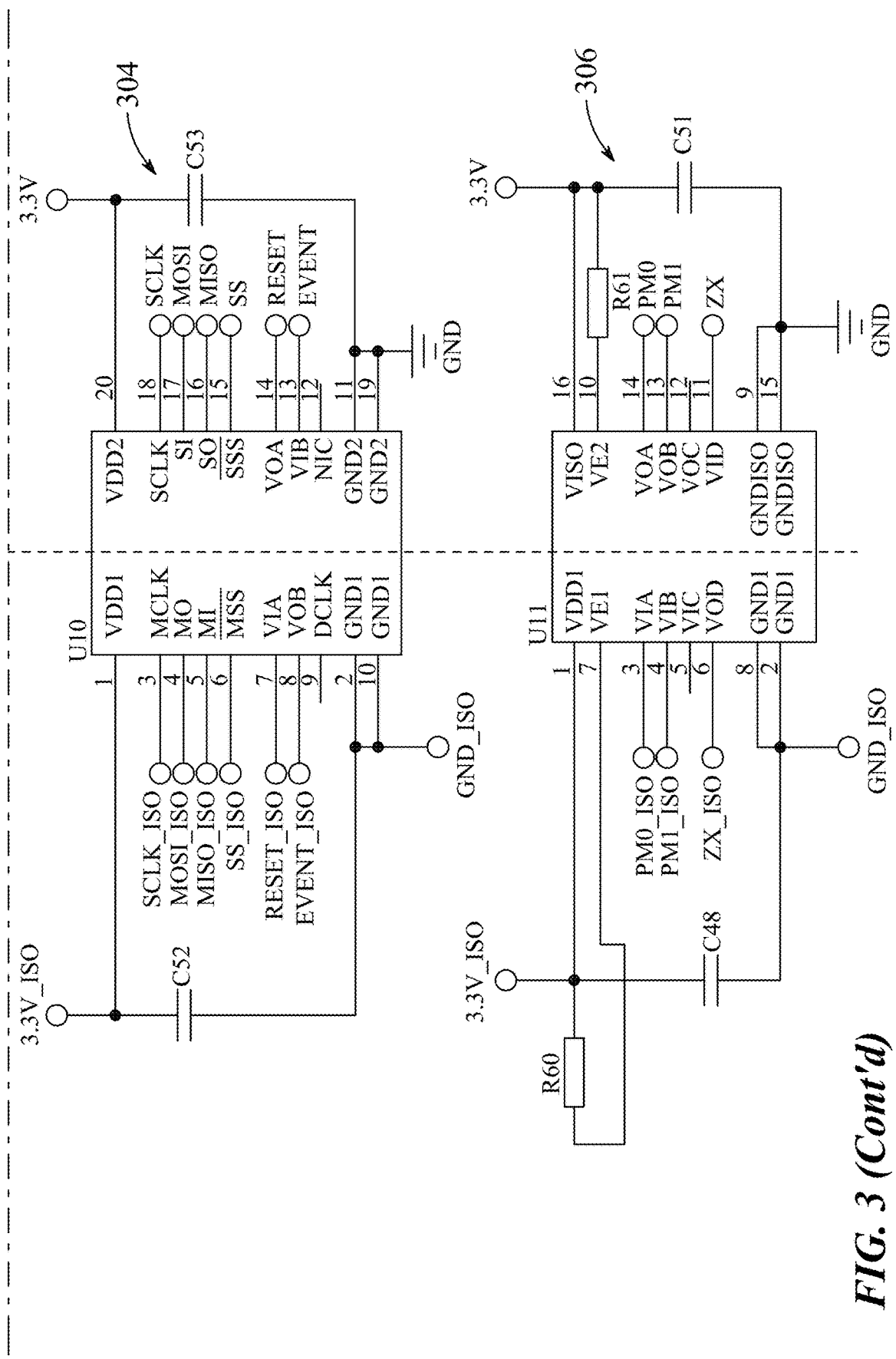

The dual-processor board 104 may be isolated from the dedicated energy metering chip 102 using an isolation barrier. The isolation barrier may be placed between the dedicated energy metering chip 102 and the dual-processor board 104. The dedicated energy metering chip 102 may communicate with the real-time microcontroller 112 using isolated data channels provided by the isolation barrier. The isolation barrier is explained in further detail with reference to FIG. 3 depicting a circuit diagram of the isolation barrier.

The digital power measurements are generated at high frequencies or sampling rates. The CPU 114 may provide the digital power measurements to a high-level programming language preferred for analyzing data received at high frequencies. The CPU 114 may execute one or more power analytics algorithms on the digital power measurements as they are received and stored in the memory unit 116 by the real-time microcontroller 112, and provide feedback immediately to evaluate results of the one or more power analytics algorithms. In an aspect of the present disclosure, the CPU 114 may execute the one or more power analytics algorithms in a Linux environment using the high-level programming language such as Python, Java, R, and the like. The CPU 114 running in Linux operating system environment may be user-friendly when running the one or more power analytics algorithm and communicating through networks as these all can be performed using the high-level programming language.

The poly phase smart meter 100 may include an Application Programming Interface (API) designed in the high-level programming language. The API supports a user computing device to periodically access and/or analyze the digital power measurements. Thus, the user may not have to directly interact with the dedicated energy metering chip 102. Thus, the poly phase smart meter 100 exposes the dedicated energy metering chip 102 to a higher-level programmable interface that allows performing any needed operation on the digital power measurements without directly interacting with the dedicated energy metering chip 102 at a lower level.

The real-time microcontroller 112 and the CPU 114 may communicate via the memory unit 116. The communication between the real-time microcontroller 112 and the CPU 114 may allow users, such as developers to access various registers and configuration of the dedicated energy metering chip 102 by passing commands to the real-time microcontroller 112. Thus, the dedicated energy metering chip 102 is exposed to a higher-level application.

The poly phase smart meter 100, according to the aspects of the present disclosure, includes a hardware design which has two parts, a first part that includes the dedicated energy metering chip 102 and a second part that includes the real-time microcontroller 112 and the CPU 114. The dedicated energy metering chip 102 is configured to sample the voltage and current measurements at very high sampling rates ranging from 8 ksps to 32 ksps and generate digital power measurements. The real-time microcontroller 112 is dedicated to receive the digital power measurements generated at such high sampling rates while the CPU 114 is available to dedicatedly perform analysis on the digital power measurements. This results in determining the power consumption of the facility in real-time, monitoring the quality of the poly phase electrical power supply line 120 in real-time, and performing advanced analysis, such as disaggregating the power consumption into per electrical load level in real-time.

A backend architecture, consisting of an application programming interface (API) server and a message queuing telemetry transport (MQTT) broker, may facilitate interaction between the user computing device and the poly phase smart meter 100. The backend architecture is described in further detail with reference to FIGS. 7A, 7B, and 7C.

Figure 2A:
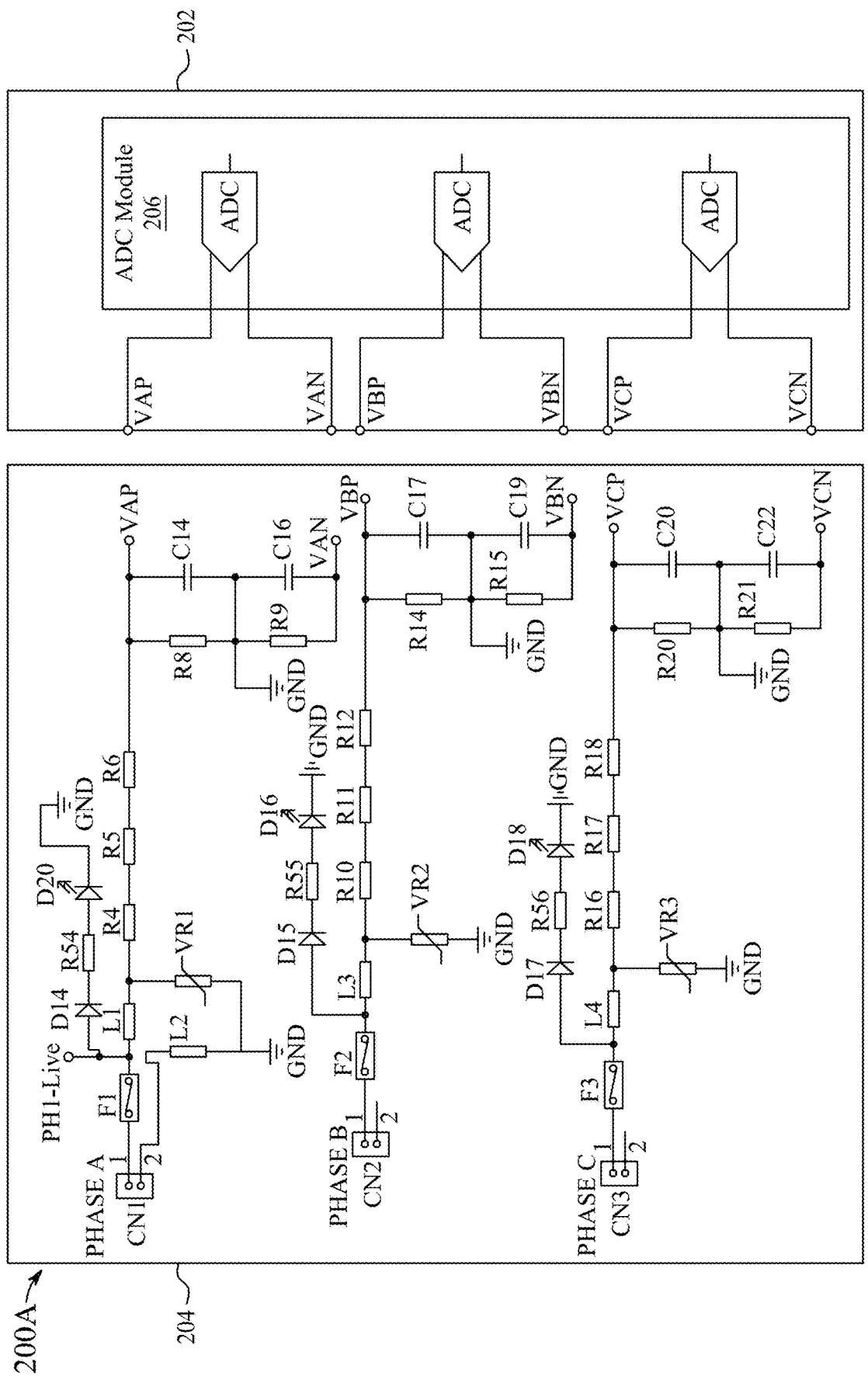
FIG. 2A is an interface circuitry, according to exemplary aspects of the present disclosure.

FIG. 2A depicts a voltage sensing interface circuitry 200A, according to exemplary aspects of the present disclosure.

The interface circuitry 200A may include a dedicated energy metering chip 202, a voltage sensing circuitry 204, and the ADC module 206. The voltage sensing circuitry 204 provides electrical connections between the poly phase electrical power supply line 120 and the dedicated energy metering chip 202. The dedicated energy metering chip 202 corresponds to the dedicated energy metering chip 102 and the ADC module 206 may correspond to the ADC module 106 of FIG. 1.

As depicted in FIG. 2A, the voltage sensing circuitry 204 includes three connectors, CN1, CN2, CN3 that connect with phase A, phase B, and phase C, respectively, of the poly phase electrical power supply line 120. The voltage sensing circuitry 204 further includes resettable fuses (F1, F2, F3), inductors (L1, L2, L3, L4), diodes (D14, D15, D17), resistors (R4, R5, R6, R8, R9, R10, R11, R12, R14, R15, R16, R17, R18, R20, R21, R54, R55, R56), variable resistors (VR1, VR2, VR3), light emitting diodes (D16, D18, D20), and capacitors (C14, C16, C17, C19, C20, C22).

For each phase of the poly phase electrical power supply line 120, the voltage sensing circuitry 204 may sense the voltage. The voltage sensed by the voltage sensing circuitry 204 for each phase may be output as the voltage measurements to the dedicated energy metering chip 202. As depicted in FIG. 2A, the voltage sensing circuitry 204 outputs $V_{AP}$ and $V_{AN}$ as the voltage measurement for phase A, $V_{BP}$ and $V_{BN}$ as the voltage measurement for phase B, and $V_{CP}$ and $V_{CN}$ as the voltage measurement for phase C. The outputs $V_{AP}$ and $V_{AN}$, $V_{BP}$ and $V_{BN}$, and $V_{CP}$ and $V_{CN}$ from the voltage sensing circuitry 204 may be connected to corresponding input pins of the dedicated energy metering chip 202. The dedicated energy metering chip 202 receives the voltage measurements for each phase of the poly phase electrical power supply line 120 via the input pins VAP, VAN, VBP, VBN, VCP, and VCN.

The ADC module 206 may include one or more analog-to-digital converters corresponding to each phase of the poly phase electrical power supply line 120. The voltage measurement received for each phase at the input pins may be input to the corresponding analog-to-digital converter. The analog-to-digital converters may sample the voltage measurement for each phase to digital data format.

Figure 2B:
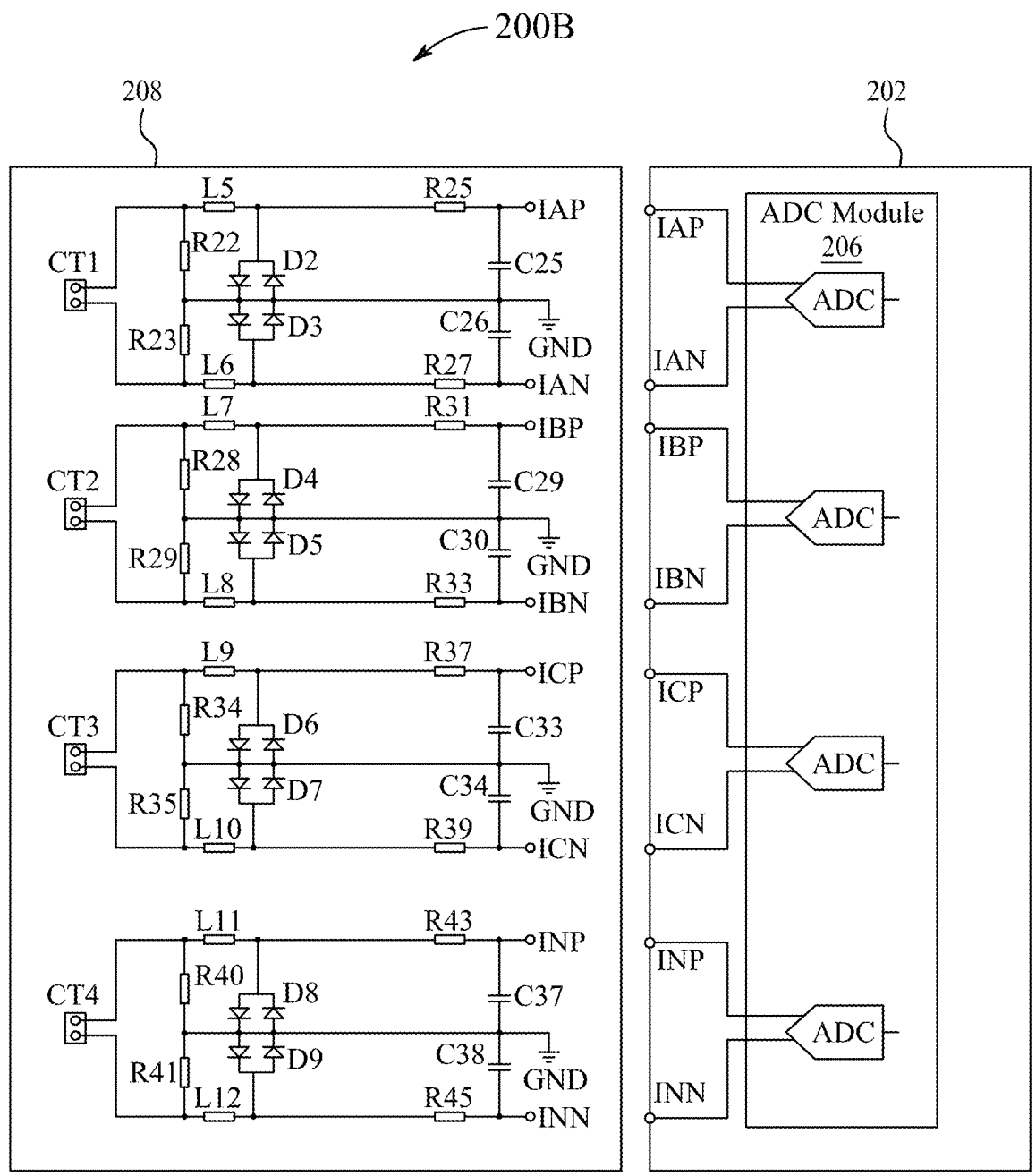
FIG. 2B is an interface circuitry, according to exemplary aspects of the present disclosure.

FIG. 2B depicts a current sensing interface circuitry 200B, according to exemplary aspects of the present disclosure.

The interface circuitry 200B includes the dedicated energy metering chip 202, a current sensing circuitry 208, and the ADC module 206. The current sensing circuitry 208 provides electrical connections between the poly phase electrical power supply line 120 and the dedicated energy metering chip 202.

As depicted in FIG. 2B, the current sensing circuitry 208 includes four current transformers (CT) clamps or connectors, CT1, CT2, CT3, and CT4 that connect with phase A, phase B, phase C, and a neutral line, respectively, of the poly phase electrical power supply line 120. The current sensing circuitry 208 further includes inductors (L5, L6, L7, L8, L9, L10, L11, L12), diode arrays (D2, D3, D4, D5, D6, D7, D8, D9), resistors (R22, R23, R25, R27, R28, R29, R31, R33, R34, R35, R37, R39, R40, R41, R43, R45), and capacitors (C25, C26, C29, C30, C33, C34, C37, C38).

For each phase and the neutral line of the poly phase electrical power supply line 120, the current sensing circuitry 208 may sense the current. The current sensed by the current sensing circuitry 208 for each phase, and neutral line may be output as the current measurements to the dedicated energy metering chip 202. As depicted in FIG. 2B, the current sensing circuitry 208 outputs $I_{AP}$ and $I_{AN}$ as the current measurement for phase A, $I_{BP}$ and $I_{BN}$ as the current measurement for phase B, $I_{CP}$ and $I_{CN}$ as the current measurement for phase C, and $I_{NP}$ and $I_{NN}$ as the current measurement for the neutral line. The outputs $I_{AP}$ and $I_{AN}$, $I_{BP}$ and $I_{BN}$, $I_{CP}$ and $I_{CN}$, and $I_{NP}$ and $I_{NN}$ from the current sensing circuitry 208 may be connected to corresponding input pins of the dedicated energy metering chip 202. The dedicated energy metering chip 202 receives the current measurements for each phase and neutral line of the poly phase electrical power supply line 120 via the input pins IAP, IAN, IBP, IBN, ICP, ICN, INP, and INN.

The ADC module 206 may include an analog-to-digital converter corresponding to each phase and neutral line of the poly phase electrical power supply line 120. The current measurement received for each phase and neutral line at the input pins may be input to the corresponding analog-to-digital converter. The analog-to-digital converters may sample the current measurement for each phase and neutral line to digital data format.

FIG. 3 depicts an isolation circuitry 300, according to exemplary aspects of the present disclosure.

According to aspects of the present disclosure, the isolation circuitry 300 provides an isolation barrier between the dedicated energy metering chip 102 and the dual-processor board 104. The isolation circuitry 300 may include a first circuit module 302, a second circuit module 304, and a third circuit module 306. The first circuit module 302 may include an isolated DC/DC converter IC (U9), capacitors (C15, C18, C21, C46, C49, C50), and a resistor (R59). The second circuit module 304 may include a six channel digital isolator for SPI interface IC (U10) and capacitors (C52, C53). The third circuit module 306 may include a quad channel digital isolator IC (U11), resistors (R60, R61), and capacitors (C48, C51). The electrical components, power supply connections, and ground connections may be connected as depicted in FIG. 3.

Figure 4:
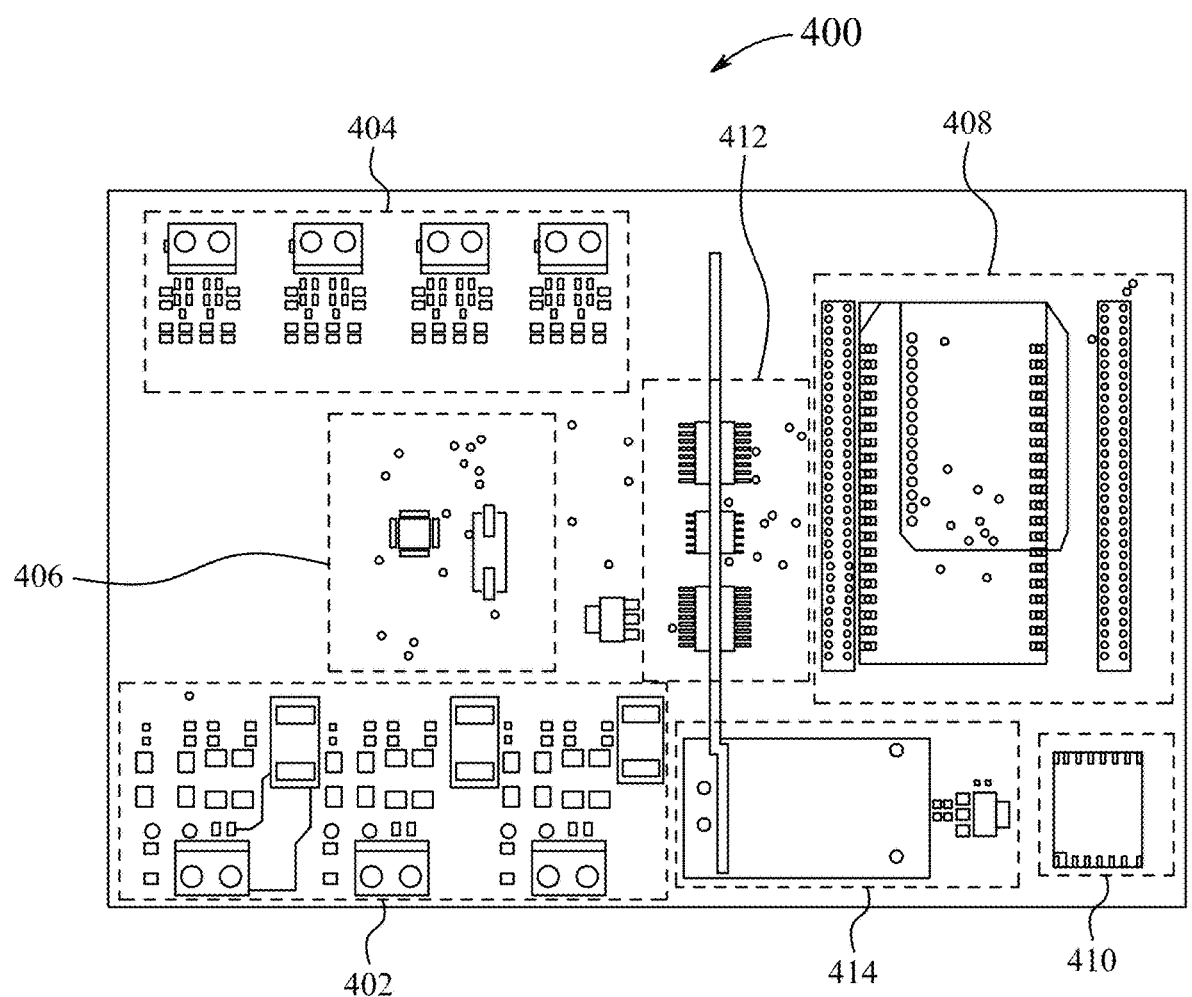
FIG. 4 is a schematic diagram of a printed circuit board (PCB) of a poly phase smart meter, according to exemplary aspects of the present disclosure.

FIG. 4 depicts a schematic diagram of a printed circuit board (PCB) 400 of the poly phase smart meter 100, according to exemplary aspects of the present disclosure.

According to aspects of the present disclosure, the PCB 400 includes a plurality of circuitries which include various components such as integrated circuits (ICs), resistors, capacitors, inductors, variable resistors, diodes, light emitting diodes (LEDs), resettable fuses, and electrical connections. The PCB 400 includes a voltage sensing circuitry 402, a current sensing circuitry 404, a dedicated energy metering chip module 406, a dual-processor board 408, a communication module 410, an isolation circuitry 412, and a power supply module 414.

The voltage sensing circuitry 402 may correspond to the voltage sensing circuitry 204, the current sensing circuitry 404 may correspond to the current sensing circuitry 208, the dedicated energy metering chip module 406 may correspond to the dedicated energy metering chip 102, the dual-processor board 408 may correspond to the dual-processor board 104, the communication module 410 may correspond to the communications unit 118, and the isolation circuitry 412 may correspond to the isolation circuitry 300.

The voltage sensing circuitry 402 may sense the voltage for each phase of the poly phase electrical power supply line 120 and output the voltage measurements for each phase. The voltage sensing circuitry 402 may include one or more electrical components such as resettable fuses, inductors, diodes, resistors, variable resistors, light emitting diodes, capacitors, and electrical connections.

The current sensing circuitry 404 may sense the current for each phase and neutral line of the poly phase electrical power supply line 120 and output the current measurements for each phase and the neutral power line. The current sensing circuitry 404 may include one or more electrical components such as inductors, diode arrays, resistors, capacitors, and electrical connections.

The dedicated energy metering chip module 406 may include the dedicated energy metering chip 102 and various other electrical components such as resistors, capacitors, crystal oscillator, and electrical connections. The voltage and current measurements output for each phase from the voltage sensing circuitry 402 and the current sensing circuitry 404, respectively, are input to the corresponding pins of the dedicated energy metering chip 102. The dedicated energy metering chip 102 may be a poly phase energy and power quality measurement integrated circuit, such as ADE9000 from Analog Devices Inc.

The dual-processor board 408 may include one or more development boards equipped with one or more microprocessors, one or more microcontrollers or programmable real-time units (PRUs), in-built memory, communication interface, external memory interface, peripheral connection module, and various other electronic components.

The dual-processor board 408 may be equipped with a development board that may include both, the real-time microcontroller 112 and the CPU 114. In a non-limiting example, the dual-processor board 408 may be equipped with a development board such as BeagleBone Black, BeagleBone Green, SanCloud BeagleBone Enhanced, and BeagleBone AI. Such development boards may include a first computing unit which may perform the functions of the real-time microcontroller 112, i.e., receiving the digital power measurements generated at high sampling rates ranging from 8 ksps to 32 ksps and a second computing unit which may perform the functions of the CPU 114, i.e., analyzing the digital power measurements in real-time. For example, the BeagleBone development boards may include an AM3358 Sitara™ Processor. The AM3358 Sitara™ Processor features Up to 1-GHz Sitara™ ARM® Cortex®-A8 32-Bit RISC Processor, Two Programmable Real-Time Units (PRUs), On-Chip Memory (Shared L3 RAM), and various other electronic modules. The two PRUs may be configured to perform the functions of real-time microcontroller 112 and the Sitara™ ARM® Cortex®-A8 32-Bit RISC Processor may be configured to perform the functions of the CPU 114. Further, the On-Chip Memory may correspond to the memory unit 116.

The dual-processor board 408 may be equipped with more than one development board to perform the functions of the real-time microcontroller 112 and the CPU 114. In a non-limiting example, the dual-processor board 408 may be equipped with two development boards such as ESP32-DevKitC (available from Espressif Systems, 690 Bibo Road Block 2 Suite 204, Zhangjiang Shanghai, China) and Onion Omega2 (available from Onion Corporation, 179 Lincoln St #405, Boston, Mass. 02111, United States). The ESP32-DevKitC includes microcontroller unit (MCU) module ESP32-WROOM-32. The Onion Omega2 includes a MediaTek MT7688AN SoC (available from MediaTek Inc. No. 1, Dusing 1st Rd., Hsinchu Science Park, Hsinchu, 30078, Taiwan) that features a 580 MHz MIPS CPU. The microcontroller unit module of the ESP32-DevKitC may be configured to perform the functions of real-time microcontroller 112 and the CPU of the Onion Omega2 may be configured to perform the functions of the CPU 114.

The dual-processor board 408 may be custom-built to include both, the real-time microcontroller 112 and the CPU 114.

The communication module 410 may include a radio frequency transceiver module to establish communication between the poly phase smart meter 100 and a user computing device over a wireless network. In a non-limiting example, the communication module 410 may include a long range RF transceiver module RFM95 W, available from Shenzhen HOPE Microelectronics Co., Ltd., 2/F, Building3, pingshan Private Enterprise science and Technology Park, Xili Town, Nanshan District, Shenzhen, China. The PCB 400 may include the isolation circuitry 412. The isolation circuitry 412 isolates the dual-processor board 408 from the dedicated energy metering chip module 406, the voltage sensing circuitry 402, and the current sensing circuitry 404. The isolation circuitry 412 may correspond to the isolation circuitry 300 explained with reference to FIG. 3

The PCB 400 may include the power supply module 414 shown in FIG. 4. The power supply module 414 may include a switch power supply module that receives AC power as input from one of the phases of the poly phase electrical power supply line 120 and outputs DC power. For example, the switch power supply module may receive 120-230V AC supply as input and generate 5V DC at the output. The power supply module 414 may be connected to a voltage regulator integrated circuit.

Figure 5:
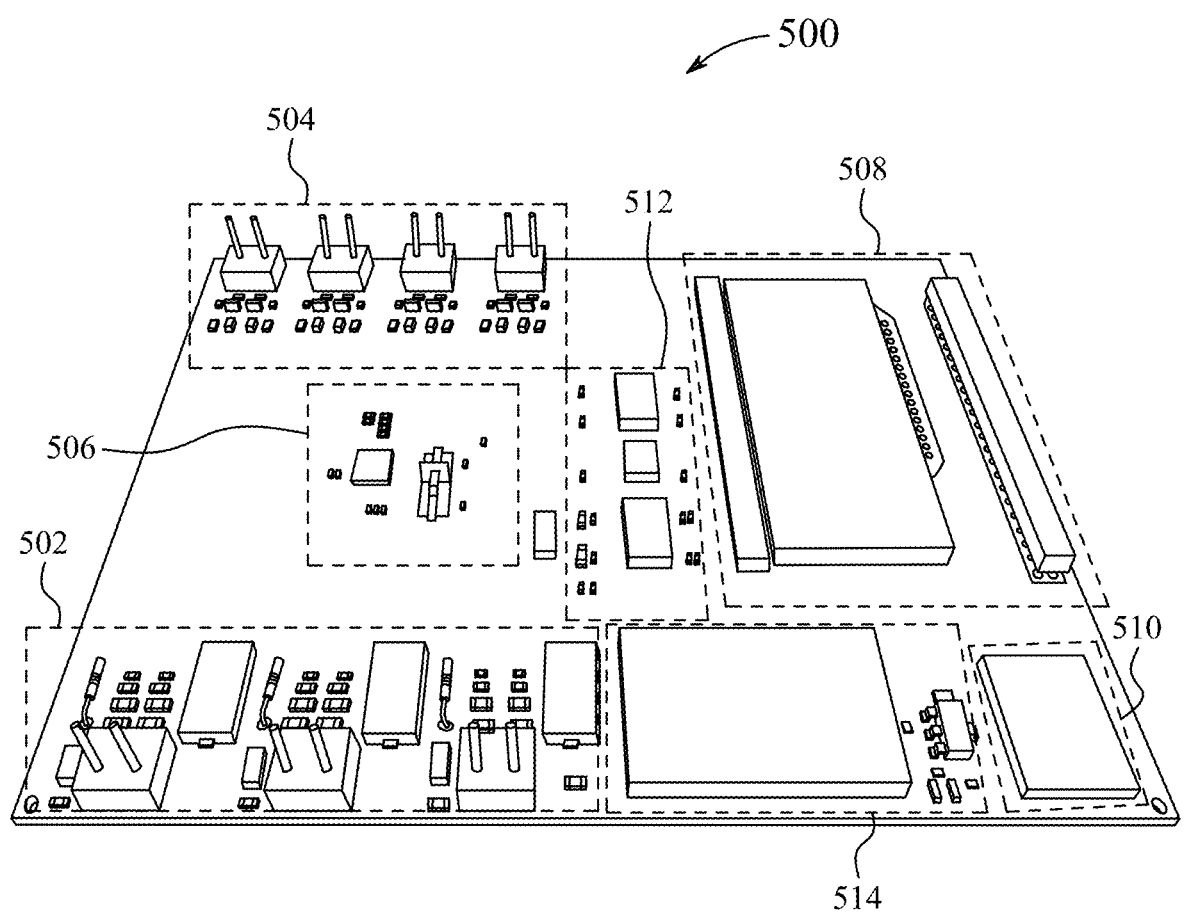
FIG. 5 is a 3D schematic diagram of a poly phase smart meter, according to exemplary aspects of the present disclosure.

FIG. 5 depicts a 3D schematic diagram of the poly phase smart meter 100, according to exemplary aspects of the present disclosure. The 3D schematic diagram 500 depicts a voltage sensing circuitry 502, a current sensing circuitry 504, a dedicated energy metering chip module 506, a dual-processor board 508, a communication module 510, an isolation circuitry 512, and a power supply module 514.

The voltage sensing circuitry 502 may correspond to the voltage sensing circuitry 402, the current sensing circuitry 504 may correspond to the current sensing circuitry 404, the dedicated energy metering chip module 506 may correspond to the dedicated energy metering chip module 406, the dual-processor board 508 may correspond to the dual-processor board 408, the communication module 510 may correspond to the communication module 410, an isolation circuitry 512 may correspond to the isolation circuitry 412, and the power supply module 514 may correspond to the power supply module 414.

Figure 6:
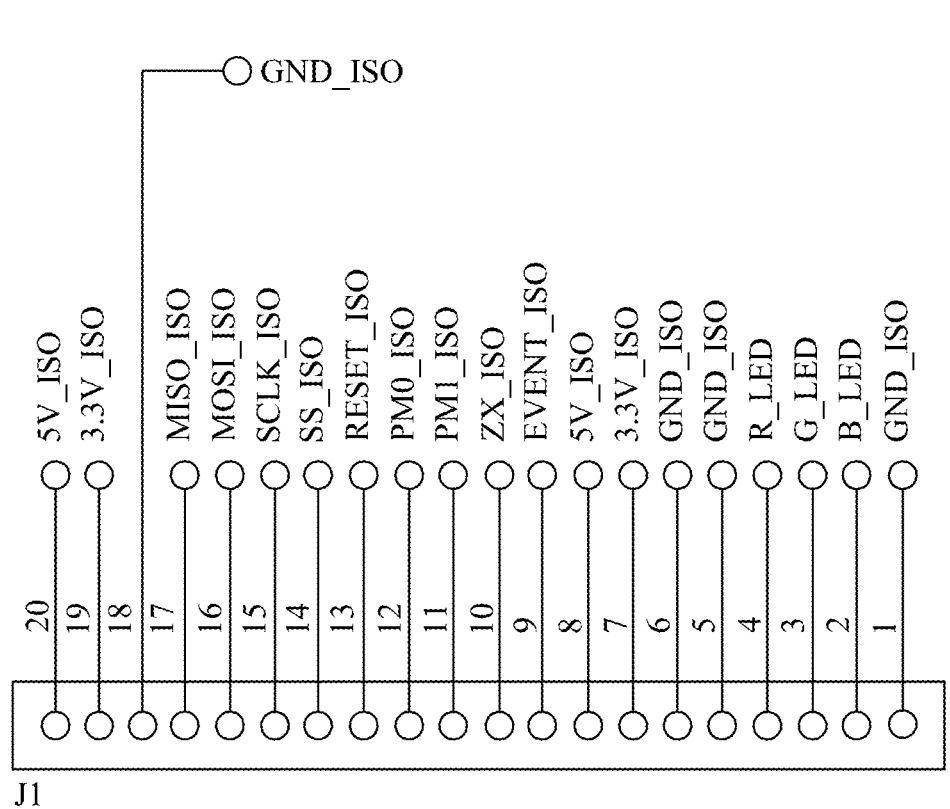
FIG. 6 is a schematic diagram of electronic circuit components of a poly phase smart meter, according to exemplary aspects of the present disclosure.
Figure 6:
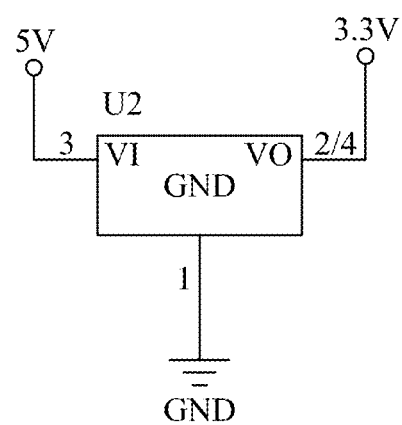
Figure 6:
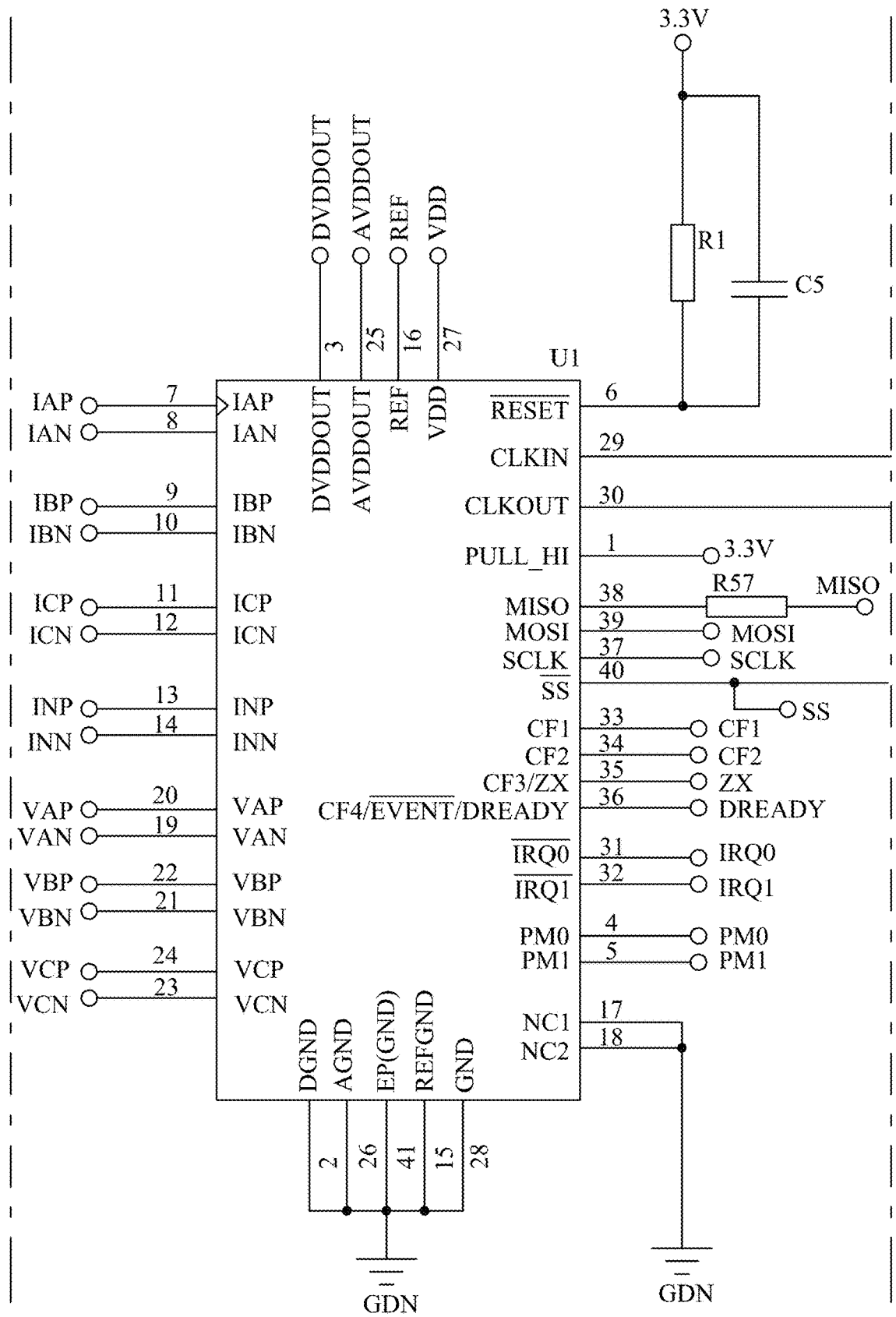
Figure 6:
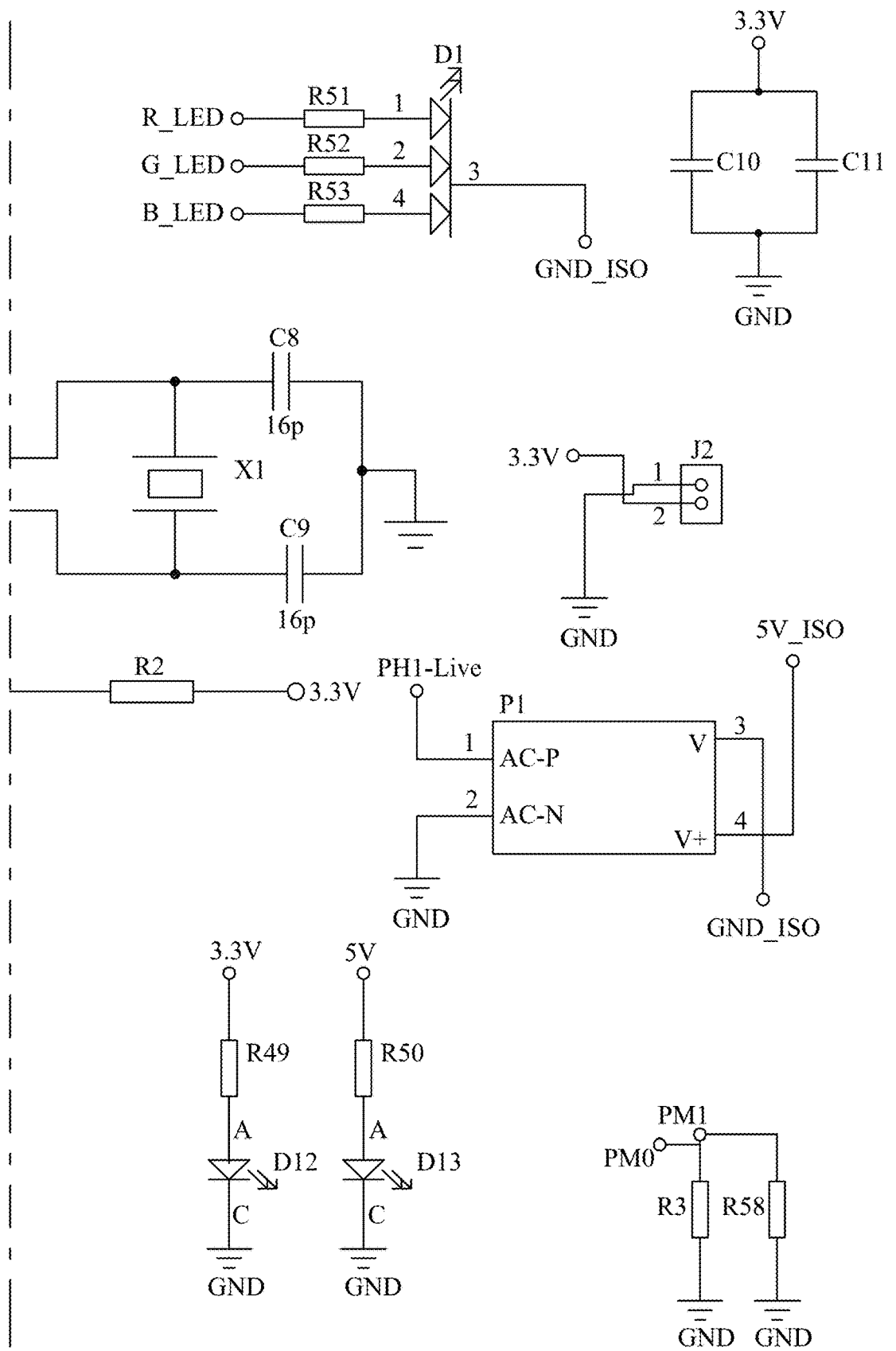
Figure 6:
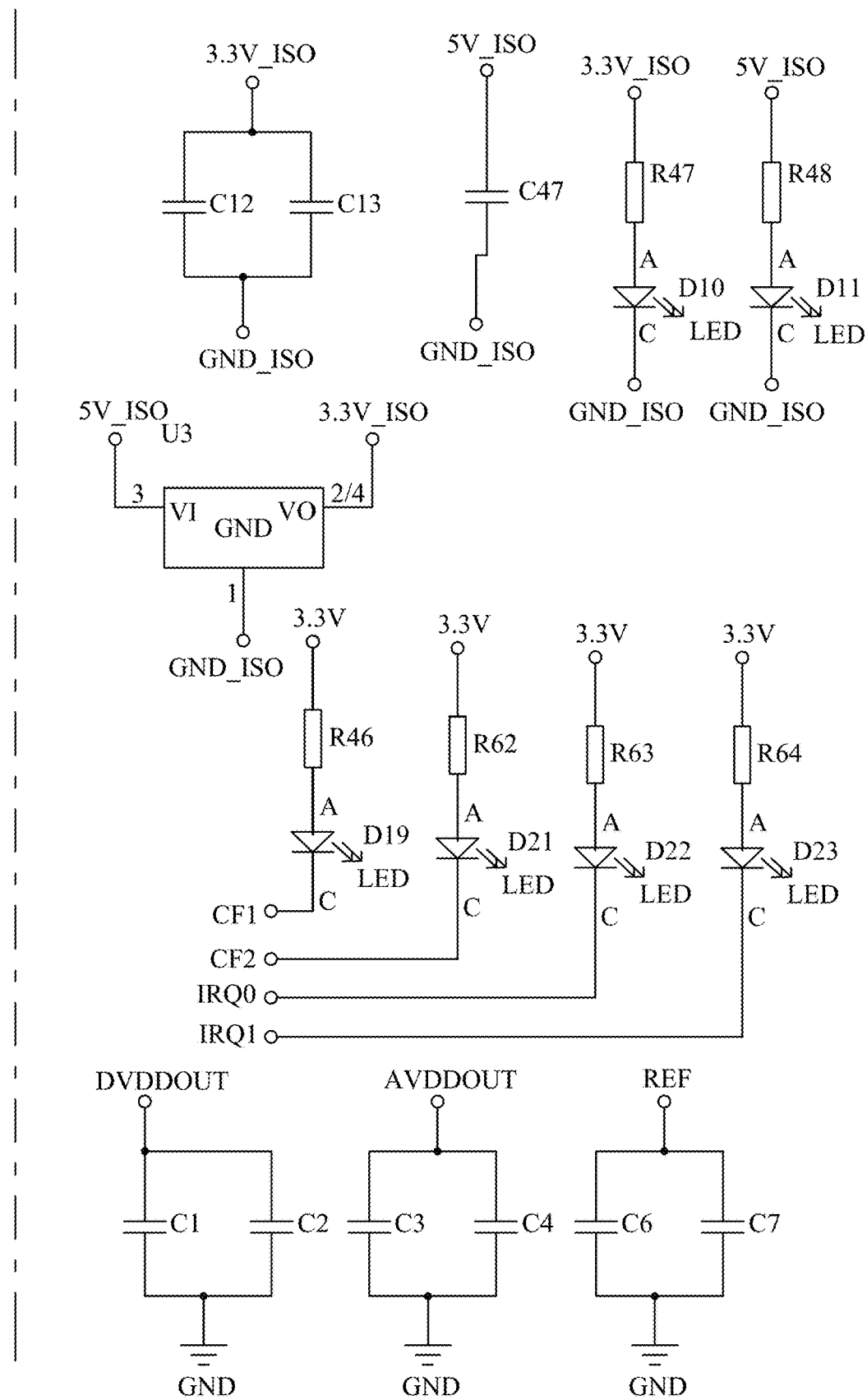

FIG. 6 depicts a schematic diagram of electronic circuit components of the poly phase smart meter 100 on a circuit board layout, according to exemplary aspects of the present disclosure.

The poly phase smart meter 100 includes various electrical circuit components such as dedicated energy metering chip (U1), voltage regulator ICs (U2 and U3), AC to DC converter (P1), single in-line socket (J1 and J2), crystal (X1), LEDs (D1, D10, D11, D12, D13, D19, D21, D22 and D23), resistors (R1, R2, R3, R46, R47, R48, R49, R50, R51, R52, R53, R57, R58, R62, R63 and R64), and capacitors (C1, C2, C3, C4, C5, C6, C7, C8, C9, C10, C11, C12, C13 and C47) as depicted in FIG. 6.

FIG. 7A illustrates the manner in which secure MQTT communication is established between a mobile application and the poly phase smart meter 100, according to exemplary aspects of the present disclosure.

According to aspects of the present disclosure, a user computing device 702 (for example, mobile device) may have the mobile application installed to interact with the poly phase smart meter 100.

In an aspect of the present disclosure, the mobile application running on the user computing device 702 and the poly phase smart meter 100 may be authenticated. To authenticate, a user account may be first created through the mobile application and then a unique barcode on the poly phase smart meter 100 may be scanned via the user computing device to link the poly phase smart meter 100 to the user account and allow for further communication between the user computing device 702 and the poly phase smart meter 100. The poly phase smart meter 100 may include a built-in memory that may contain a unique ID for the poly phase smart meter 100. The barcode may contain the unique ID, and by scanning the barcode, an API server 704 may link the user computing device 702 to the user account. In a non-limiting example, when a user scans the barcode, the mobile application may attempt to communicate with the poly phase smart meter 100 through a local network using User Datagram Protocol (UDP) broadcasting to ensure the poly phase smart meter 100 has been setup in the user's facility and is not scanning any other smart meter. The UDP broadcasting may be performed to protect the poly phase smart meter 100 from being linked to potentially malicious users. In a non-limiting example, an encrypted JSON web token may be used to keep the user computing device 702 and the poly phase smart meter 100 authenticated and allowing further operations to be performed without performing the authentication again.

In an aspect of the present disclosure, the API server 704 may provide a notification service to the poly phase smart meter 100 to send push notifications to the user computing device 702. The user may program the poly phase smart meter 100 to send the push notifications to the user computing device 702 when a predetermined event occurs. The poly phase smart meter 100 may constantly check for the predetermined event. When the predetermined event occurs, the poly phase smart meter 100 may collect data associated with the predetermined event and call the API server 704 through the API of the poly phase smart meter 100 to send a secure push notification that contains the data associated with the predetermined event to the user computing device 702. In an aspect of the present disclosure, the user may program the poly phase smart meter 100 to define the data to be included in the secure push notification when the predetermined event occurs. In a non-limiting example, the user can program the poly phase smart meter 100 to: a) send a push notification when the daily power consumption reaches a predetermined threshold, b) send, for example, after every one hour, a push notification including the power consumption of that hour as a percentage of a predetermined threshold of daily power consumption, or c) send a notification when a predetermined home appliance, such as an AC is turned on within a predetermined time period.

In an aspect of the present disclosure, the CPU 114 of the poly phase smart meter 100 may periodically compare a power usage of an electrical load at the facility with a programmed power usage threshold for that electrical load. When the power usage of the electrical load exceeds the programmed power usage threshold, the CPU 114 may calculate the power usage of the electrical load as a percentage of the programmed power usage threshold. The CPU 114 may generate a push notification including the percentage. The communications unit 118 of the poly phase smart meter 100 may transmit the push notification including the percentage to the user computing device 702.

In an aspect of the present disclosure, the API server 704 may provide a backup functionality for the poly phase smart meter 100 to backup data, custom programs, and predetermined events. In an event of a factory reset or failure, the API server 704 may restore the poly phase smart meter 100 with the backed-up data, custom programs, and predetermined events.

In an aspect of the present disclosure, the API server 704 may provide a service that lets the mobile application establish a MQTT connection with the poly phase smart meter 100 through a MQTT broker 706. The MQTT connection allows for fast bi-directional communication between the mobile application and the poly phase smart meter 100. When the poly phase smart meter 100 connects to the MQTT broker 706, the API server 704 ensures that only the user computing device 702 accesses and communicates with the poly phase smart meter 100. To ensure this, encrypted certificates may be issued that manage authorization of the user to access and communicate only with their poly phase smart meter 100.

In an aspect of the present disclosure, FIG. 7A depicts how a secure MQTT communication is established between the mobile application and the poly phase smart meter 100. The mobile application may be executed in the user computing device 702. The mobile application may send the MQTT connection request to the API server 704. In response to the MQTT connection request, the API server 704 may send a user unique certificate to the mobile application. In an instance, when the user unique certificate does not exist, the API server 704 may send a request to the MQTT broker 706 to create the user unique certificate and send the user unique certificate to the mobile application. The MQTT broker 706 may establish the MQTT connection allowing fast bi-directional communication between the mobile application and the poly phase smart meter 100. The communication between the mobile application and the poly phase smart meter 100 is established through the MQTT broker 706. In an aspect of the present disclosure, a secure connection between the MQTT broker 706 and the poly phase smart meter 100 may be established using the unique ID of the poly phase smart meter 100.

In an aspect of the present disclosure, the poly phase smart meter 100 may periodically check with the API server 704 if there is an update for either firmware of the poly phase smart meter 100 or the one or more power analytics algorithms. When there is a new update, the poly phase smart meter 100 may download the update from the API server 704 and install the update. In an aspect of the present disclosure, the MQTT broker 706 may create a MQTT connection for fast and secure bi-directional communication between the poly phase smart meter 100 and the API server 704.

Figure 7B:
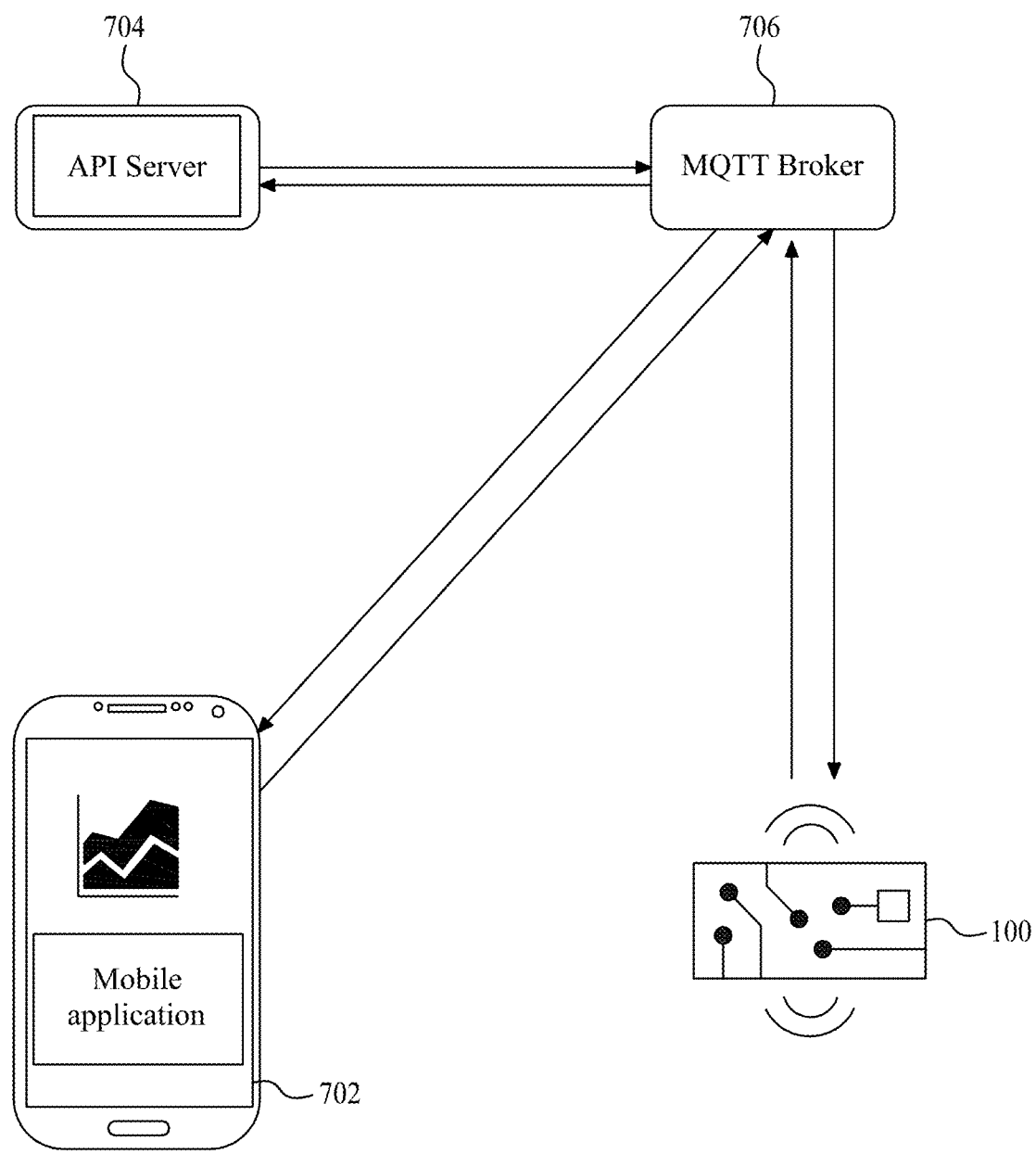
FIG. 7B illustrates the interconnection of the polyphase smart meter with a mobile application, using a secure MQTT communication, according to exemplary aspects of the present disclosure.

FIG. 7B depicts the interconnection of the polyphase smart meter with the mobile application, using the secure MQTT communication, according to exemplary aspects of the present disclosure. FIG. 7B further illustrates how live power readings may be accessed using the secure MQTT communication.

The user may start a live power reading feature in the mobile application. In response, the mobile application may send a live power reading command from the user computing device 702 to the MQTT broker 706. The MQTT broker 706 may forward the live power reading command to the poly phase smart meter 100. In response, the poly phase smart meter 100 may stream the live power reading based on predetermined settings. Streaming the live power reading may include one or more of, sharing live power consumption of the facility, sharing live power consumption of one or more predetermined electrical loads in the facility, and sharing live disaggregated power consumption for the electrical loads at the facility. The poly phase smart meter 100 may transmit the live power reading to the MQTT broker 706. The MQTT broker 706 may forward the live power reading to the user computing device 702. The mobile application may present a user interface to display the live power reading.

In an aspect of the present disclosure, the communications unit 118 of the poly phase smart meter 100 may transmit the power report to the mobile application of the user computing device 702 via the MQTT broker 706.

Figure 7C:
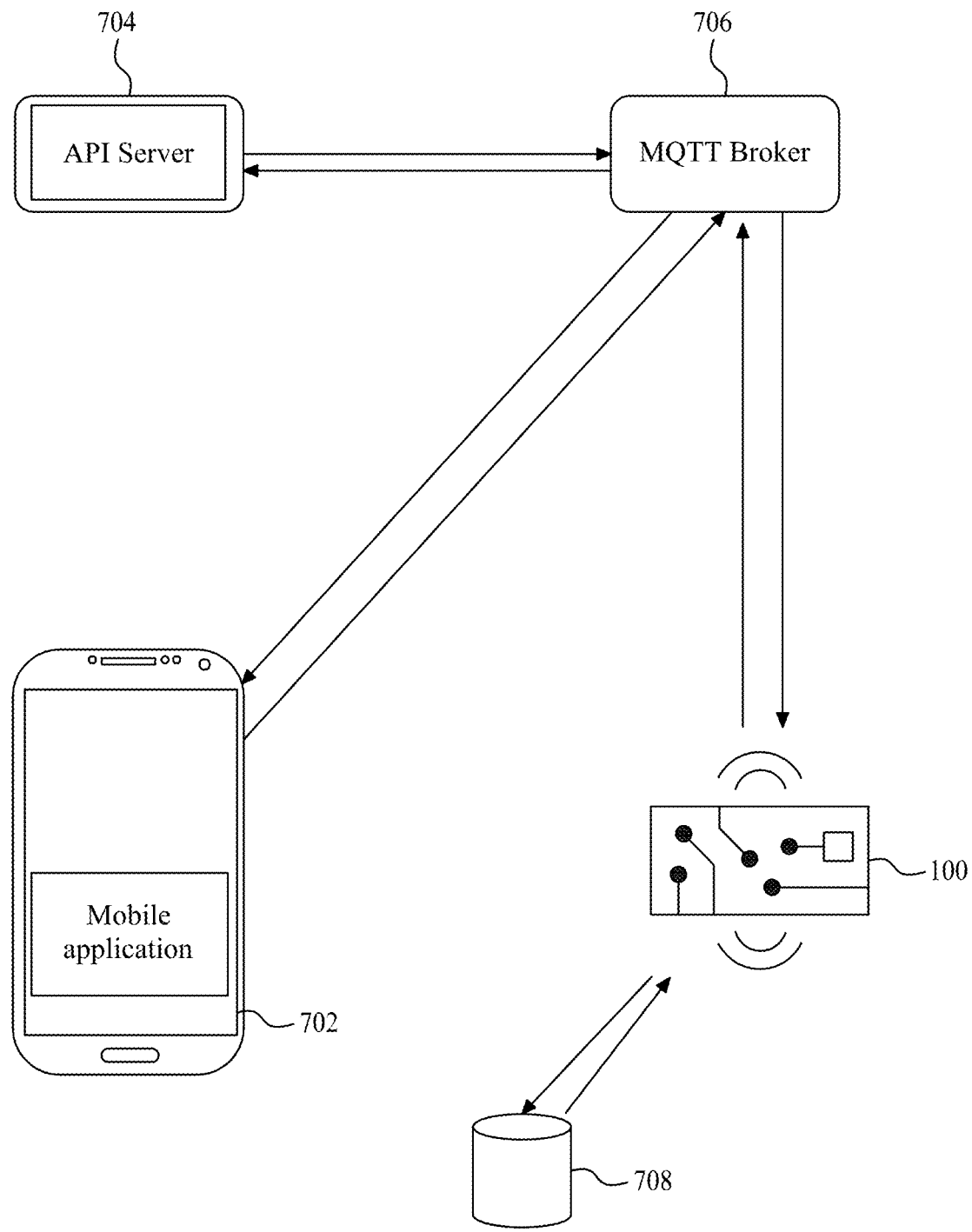
FIG. 7C is illustrates user registration of IR commands in a poly phase smart meter using a secure MQTT communication between mobile application and the poly phase smart meter, according to exemplary aspects of the present disclosure.

FIG. 7C depicts the registration of IR commands in the poly phase smart meter 100 using a secure MQTT communication between the mobile application and the poly phase smart meter 100, according to exemplary aspects of the present disclosure.

According to aspects of the present disclosure, the user may link the poly phase smart meter 100 with an infrared (IR) sensor 708 to register home appliances that are controlled with an IR remote, such as air conditioner and television. The user may use the mobile application to communicate with the poly phase smart meter 100 using the MQTT connection to start registration of the IR sensor 708. The mobile application may communicate with the poly phase smart meter 100 to assign a unique name and ID for the IR sensor 708. The mobile application may send a command to register IR signal of the IR remote to the poly phase smart meter 100 through the MQTT connection. In response, the poly phase smart meter 100 may send the command to register the IR signal to the IR sensor 708. The IR sensor 708 may send a command to record the IR signal to the poly phase smart meter 100. The poly phase smart meter 100 may send a command to press a button on the IR remote to the mobile application. In response, the user may press a button on the IR remote while pointing towards the IR sensor 708. The IR sensor 708 may record the IR signal when the user presses the button on the IR remote and transmits the recorded IR signal to the poly phase smart meter 100. The poly phase smart meter 100 stores the recorded IR signal from the IR remote. The setup procedure for the IR sensor 708 is complete for the home appliance corresponding to the IR remote. In an aspect of the present disclosure, the IR sensor 708 may be setup for a plurality of IR remote controlled home appliances.

In an aspect of the present disclosure, the poly phase smart meter 100 may send power on/off commands to the registered IR remote controlled home appliances via the IR sensor 708. In an aspect of the present disclosure, the poly phase smart meter 100 may send on/off commands based on predetermined criteria. In a non-limiting example, the poly phase smart meter 100 may send IR signal to power off when a home appliance has reached a predetermined threshold for daily power consumption, send the IR signal to power on or off a home-appliance at a predetermined time, or send the IR signal to power off a home-appliance after a predetermined interval.

In an aspect of the present disclosure, the mobile application may provide an interface to define one or more predetermined criteria for the poly phase smart meter 100 to power on/off the IR remote controlled home appliances.

In an aspect of the present disclosure, the user may access the mobile application to send a command to the poly phase smart meter 100 to power on/off the IR remote controlled home appliances.

Figure 8:
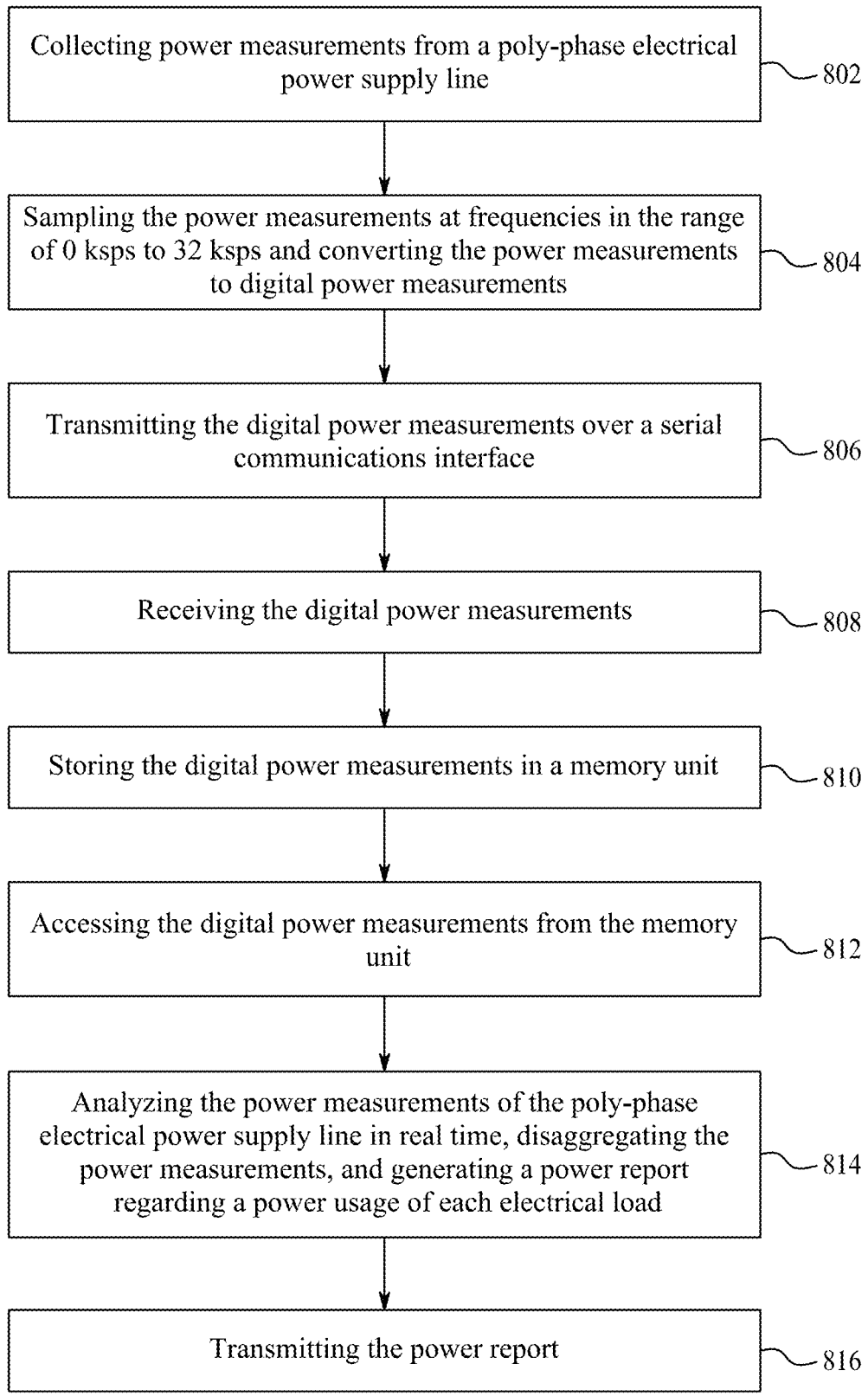
FIG. 8 is an exemplary flowchart of a method for controlling power by a poly phase smart meter of a plurality of electrical loads on a poly phase electrical power supply line, according to exemplary aspects of the present disclosure.

FIG. 8 is an exemplary flowchart of a method 800 for controlling power, by the poly phase smart meter 100, of the plurality of electrical loads on the poly phase electrical power supply line 120.

At step 802, the method 800 includes collecting, by the dedicated energy metering chip 102, the power measurements of the poly phase electrical power supply line 120. In an aspect of the present disclosure, the power measurements may include voltage and current measurement of each phase of the poly phase electrical power supply line 120. In an aspect of the present disclosure, the voltage sensing circuitry 204 and the current sensing circuitry 208 may measure the voltage and current, respectively, of the poly phase electrical power supply line 120 and output the voltage and current measurements as the power measurements to the dedicated energy metering chip 102.

At step 804, the method 800 includes sampling, by the ADC module 106, the power measurements at frequencies in the range of 0 ksps to 32 ksps and converting the power measurements to the digital power measurements. In an aspect of the present disclosure, the DSP engine 108 may determine one or more power parameters from the sampled power measurements. In an aspect of the present disclosure, the digital power measurements may include the sampled power measurements generated by the ADC module 106 and/or the one or more power parameters determined by the DSP engine 108.

At step 806, the method 800 includes transmitting, by the SPI 110, the digital power measurements over the serial communications interface to the real-time microcontroller 112.

At step 808, the method 800 includes receiving, by the real-time microcontroller 112, the digital power measurements from the SPI 110.

At step 810, the method 800 includes storing, in the memory unit 116, the digital power measurements.

At step 812, the method 800 includes accessing, by the CPU 114, the digital power measurements from the memory unit 116.

At step 814, the method 800 includes analyzing, by the CPU 114, the power measurements of the poly phase electrical power supply line 120 in real time, disaggregating the power measurements, and generating a power report regarding a power usage of each electrical load. In an aspect of the present disclosure, the CPU 114 may execute the one or more power analytics algorithms that may analyze the digital power measurements to determine power consumption of the facility in real time. The CPU 114 may perform advanced analysis to disaggregate the power consumption into per electrical load level at the facility. The CPU 114 may execute instructions to generate the power report which may include power consumption of each electrical load in the facility.

At step 816, the method 800 includes, transmitting, by the communications unit 118, the power report. In an aspect of the present disclosure, the communications unit 118 may transmit the power report to the mobile application installed on the user computing device 702. The user may access the report via a user interface presented by the mobile application on the user computing device 702.

Figure 9A:
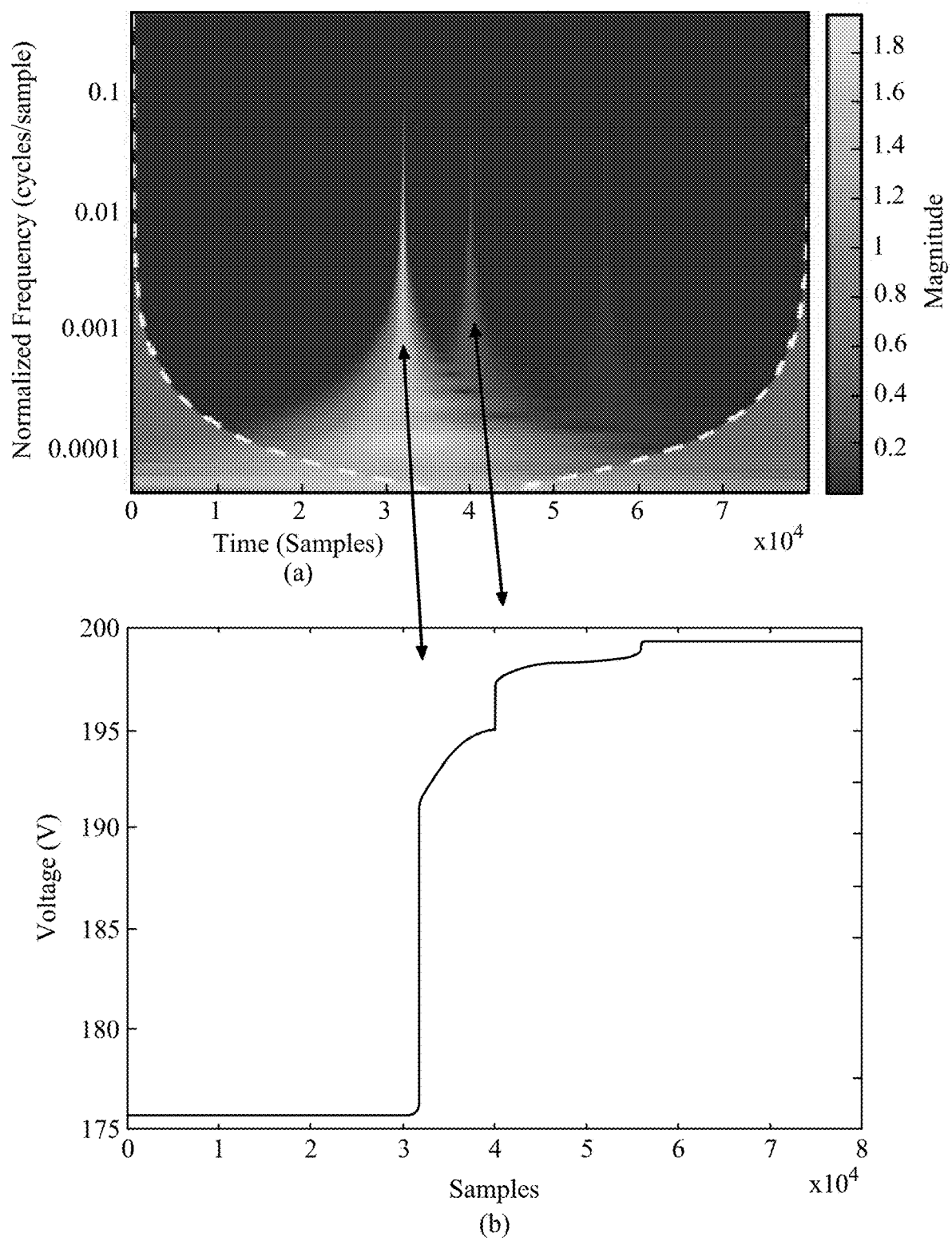
FIG. 9A is a graphical diagram illustrating real-time voltage detection with continuous wavelet transform (CWT) analysis, where (a) is a scalogram and (b) is a graphical plot of voltage measurement and sampling rate, according to exemplary aspects of the present disclosure.

FIG. 9A depicts a graphical diagram illustrating real-time voltage detection with continuous wavelet transform (CWT) analysis, according to exemplary aspects of the present disclosure.

According to aspects of the present disclosure, CWT analysis is performed for detecting changes in voltage in real-time of a first phase of the poly phase electrical power supply line 120. In an aspect of the present disclosure, for the CWT analysis, the voltage measurements are sampled at 8 ksps. The graphical diagram (a) is a scalogram representing magnitude of the CWT analysis of the voltage, plotted as a function of time and frequency. The graphical diagram (b) is a plot representing power/frequency in decibels for each cycle per sample as a function of time.

Figure 9B:
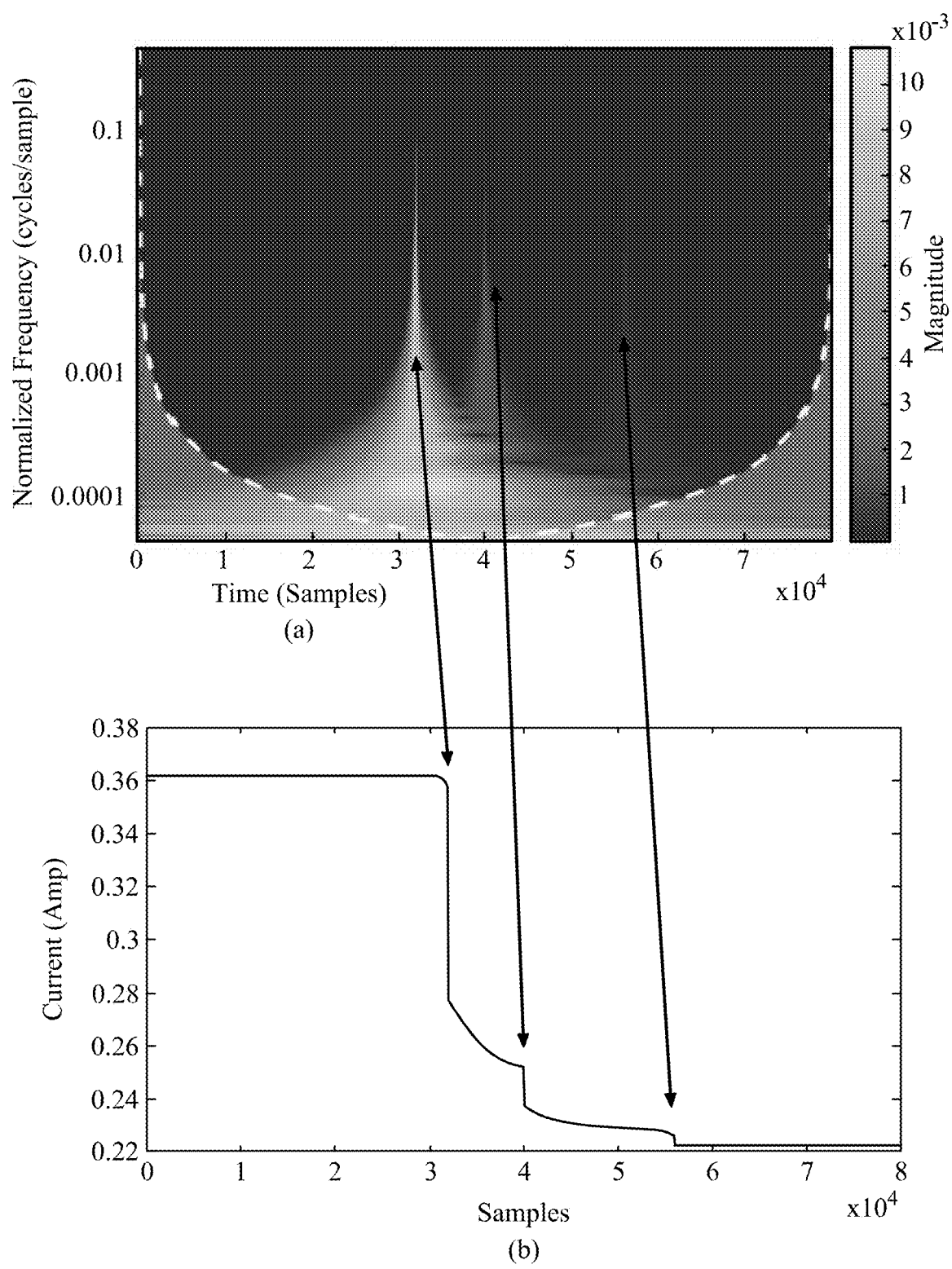
FIG. 9B is a graphical diagram illustrating real-time current detection with continuous wavelet transform (CWT) analysis, where (a) is a scalogram and (b) is a graphical plot of current measurement and sampling rate, according to exemplary aspects of the present disclosure.

FIG. 9B depicts a graphical diagram illustrating real time current detection with continuous wavelet transform (CWT) analysis, according to exemplary aspects of the present disclosure.

According to aspects of the present disclosure, CWT analysis is performed for detecting changes in current in real-time of the first phase of the poly phase electrical power supply line 120. In an aspect of the present disclosure, for the CWT analysis, the current measurements are sampled at 8 ksps. The graphical diagram (a) is a scalogram representing magnitude of the CWT analysis of the current, plotted as a function of time and frequency. The graphical diagram (b) is a plot representing current as a function of time/sampling frequency.

The poly phase smart meter 100 may detect real-time changes in both, voltage and current of the poly phase electrical power supply line 120, as shown above in FIGS. 9A and 9B, respectively. As illustrated in FIG. 9B, the poly phase smart meter 100 may be able to detect as little as 0.006 ampere changes in the current of the first phase of the poly phase electrical power supply line 120. In an aspect of the present disclosure, the CWT analysis may be implemented in the poly phase smart meter 100 by the CPU 114 using a set of instructions.

In an aspect of the present disclosure, the CWT analysis may be based on the analytic Morse wavelet with a symmetry parameter (gamma) equal to 3 and a time-bandwidth product equal to 60. The output of the CWT analysis may be beneficial in applying the one or more NILM algorithms. Thus, the poly phase smart meter 100 may be integrated with the one or more NILM algorithms with high accuracy load disaggregation.

Figure 10:
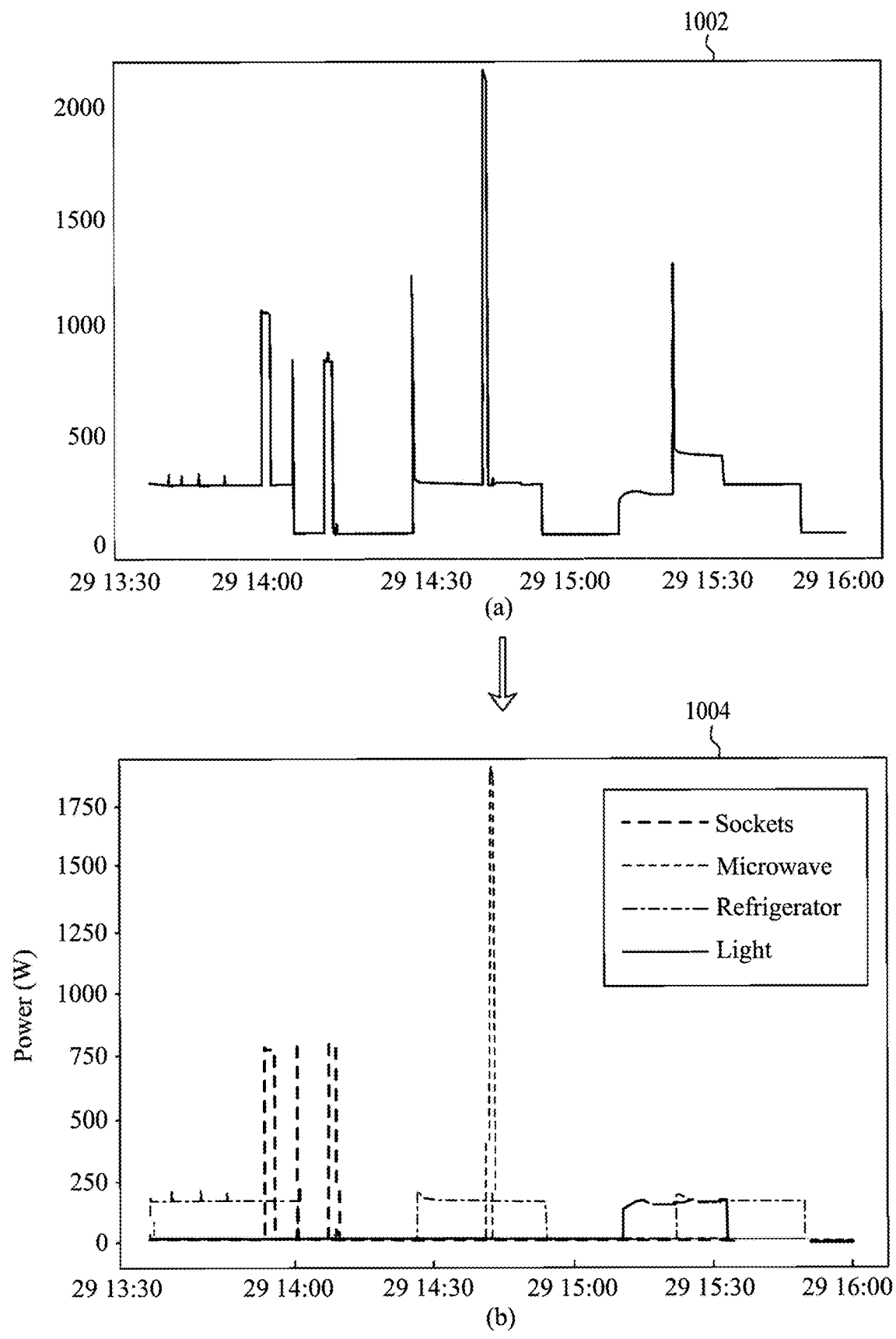
FIG. 10 is a graphical diagram illustrating total power consumption disaggregated into per electrical load level power consumption, where (a) is graphical representation of a total power consumption of a facility during a given time interval and (b) is a graphical representation of individual power consumption of various electrical loads during the same time interval, according to exemplary aspects of the present disclosure.

FIG. 10 depicts a graphical diagram illustrating total power consumption disaggregated down to per electrical load level power consumption, according to exemplary aspects of the present disclosure.

Power disaggregation corresponds to breaking down total or aggregate power consumption of the facility into the power consumption at the per electrical load level. As depicted in FIG. 10, (a) a first graph 1002 depicts total power consumption of the facility during a given time interval, i.e., 13:30 to 16:00 hours on a given day, and (b) a second graph 1004 depicts individual power consumption of various electrical loads, such as sockets, microwave, refrigerator, and lights in the facility during the same time interval. As depicted in FIG. 10, the power disaggregation determines the power consumed by each electrical load in the facility.

In an aspect of the present disclosure, power disaggregation may allow the user to determine which electrical loads are consuming more power and identify any unusual pattern in power consumption of the electrical loads. This may help the user to identify faults in one or more of the plurality of electrical loads in the facility.

In an aspect of the present disclosure, the user may determine the disaggregated power consumption of one or more of the plurality of electrical loads in real-time by generating a command using the mobile application. The mobile application may communicate with the poly phase smart meter 100 using the MQTT connection to receive the disaggregated power consumption.

The first embodiment is illustrated with respect to FIGS. 1-14. The first embodiment describes a high frequency programmable poly phase smart meter for a plurality of appliances. The high frequency programmable poly phase smart meter includes a set of clamps configured to surround a power line which supplies power to the plurality of appliances; a dedicated energy metering chip connected to receive power from the set of clamps and collect poly phase power measurements from the power line. The dedicated energy metering chip includes an analog to digital converter, ADC, the ADC configured to sample the poly phase power measurements at frequencies in the range of 0 kilo samples per second to 32 kilo samples per second and convert the poly phase power measurements to digital power measurements; and a serial interface configured to connect the dedicated energy metering chip with a dual processor. The high frequency programmable poly phase smart meter includes the dual processor. The dual processor includes a real-time microcontroller connected to the dedicated energy metering chip via the serial interface to receive the digital power measurements; a computer processing unit, CPU, connected to the real-time microcontroller, the CPU including circuitry and one or more processors having program instructions configured to analyze the poly phase power measurements in real time, disaggregate the poly phase power measurements, and generate a power report regarding a power usage of each appliance; and a memory shared by the real-time microcontroller and the CPU. The high frequency programmable poly phase smart meter includes a communications unit connected to the real-time microcontroller, wherein the communications unit is configured to transmit the power report.

The power report further includes one or more of voltage total harmonic distortion on the power line, current total harmonic distortion on the power line, a power usage graph depicting power usage of each appliance, an alert when power usage of an appliance is not within a predetermined range, a status of each appliance, an energy rating for each appliance, and an energy cost of each appliance.

The CPU is further configured to compare a power usage of an appliance to a programmed power event threshold of the appliance. When the power usage of the appliance is greater than the programmed power event threshold of the appliance, the CPU is configured to calculate a percentage of the power usage of the appliance with respect to the daily threshold of the appliance and generate a push notification including the percentage. The communications unit is further configured to transmit the push notification including the percentage.

The real-time microcontroller is configured to identify appliances having infrared sensors and generate power on/off commands to the infrared sensor when the power usage of the appliance is greater than the programmed power event threshold of the appliance.

The dedicated energy metering chip is configured to measure voltage total harmonic distortion and current total harmonic distortion of the poly phase power measurements.

The dedicated energy metering chip includes an AC current sensor; an AC voltage sensor; and an isolation circuit, wherein the isolation circuit isolates the dual processor from the dedicated energy metering chip.

The CPU is configured to disaggregate the poly phase power measurements based on a non-intrusive load monitoring calculation included in the program instructions.

The second embodiment is illustrated with respect to FIGS. 1-14. The second embodiment describes a method for controlling power by a high frequency programmable poly phase smart meter of a plurality of appliances on a power line. The method includes collecting, by a dedicated energy metering chip, poly phase power measurements from the power line; sampling, by an analog to digital converter, the poly phase power measurements at frequencies in the range of 0 kilo samples per second to 32 kilo samples per second and converting the poly phase power measurements to digital power measurements; transmitting, by a serial port interface, SPI, the digital power measurements over a serial communications interface; receiving, by a real-time microcontroller, the digital power measurements from the SPI; storing, in a memory, the digital power measurements; accessing, by a computer processing unit, CPU, the digital power measurements from the memory; analyzing, by the CPU, the CPU including circuitry and one or more processors having program instructions, the poly phase power measurements in real time, disaggregating the poly phase power measurements, and generating a power report regarding a power usage of each appliance; and transmitting, by a communications unit, the power report.

The method further comprises measuring, by the dedicated energy metering chip, voltage total harmonic distortion and current total harmonic distortion of the poly phase power measurement.

The method further comprises disaggregating the poly phase power measurements based on a non-intrusive load monitoring calculation included in the program instructions.

The method further comprises communicably connecting, by the communications unit, the high frequency programmable poly phase smart meter to a mobile application; registering the high frequency programmable poly phase smart meter with the mobile application by generating an encrypted certificate and storing the encrypted certificate in the memory; sending, by the communications unit, the power report to the mobile application; receiving, by the communications unit, power on/off commands for each appliance from the mobile application; and powering each appliance on/off based on the power on/off commands.

The method further comprises connecting, by the communications unit, the high frequency programmable poly phase smart meter to the mobile application through a message queuing telemetry transport server storing user credentials, exchanging the encrypted certificate with the message queuing telemetry transport server; matching the encrypted certification to a database of user credentials stored by the message queuing telemetry transport server; and when the encrypted certificate matches a user credential of the mobile application, permitting the high frequency programmable poly phase smart meter to bi-directionally communicate with the mobile application.

The method further comprises receiving, by the communications unit, a power event threshold for each appliance from the mobile application; storing each power event threshold in the memory; comparing an individual power usage of each appliance to its respective power event threshold; when the individual power usage of the appliance is greater than its respective power event threshold, calculating, by the CPU, a percentage of the power usage of the appliance with respect to the daily threshold of the appliance; generating, by the CPU, a push notification including the percentage; and transmitting, by the communications unit, the push notification including the percentage to the mobile application.

The method further comprises scanning, by the communications unit, for an infrared power sensor registered to one of the plurality of appliances; identifying, by the real-time microcontroller, each appliance having an infrared sensor; and generating, by a user of the mobile application, power on/off commands when the power usage of each appliance is greater than the respective programmed power event threshold of the appliance.

The third embodiment is illustrated with respect to FIGS. 1-14. The third embodiment describes a system for controlling power supplied to a plurality of appliances on a power line, comprising a dedicated energy metering chip configured to collect poly phase power measurements from the power line. The dedicated energy metering chip includes an analog to digital converter, ADC, the ADC configured to sample the poly phase power measurements at frequencies in the range of 0 kilo samples per second to 32 kilo samples per second and convert the poly phase power measurements to digital power measurements; and a serial interface to connect the dedicated energy metering chip with a dual processor, the serial interface configured to transmit the poly phase measurements. The system further includes the dual processor including a real-time microcontroller connected to the dedicated energy metering chip via the serial interface to receive the digital power measurements; a computer processing unit, CPU, connected to the real-time microcontroller, the CPU including circuitry and one or more processors having program instructions configured to analyze the poly phase power measurements in real time, disaggregate the poly phase power measurements, and generate a power report regarding a power usage of each appliance; and a memory shared by the real-time microcontroller and the CPU, the memory configured to store the digital power measurements. The system further includes a mobile application registered with the high frequency programmable poly phase smart meter; and a communications unit connected to the real-time microcontroller, the communications unit configured to transmit the power report to the mobile application, receive power on/off commands for each appliance from the mobile application and power each appliance on/off based on the power on/off commands.

The system for controlling power supplied to a plurality of appliances on a power line, further comprising: the CPU is further configured to compare a power usage of an appliance to a programmed power event threshold of the appliance; when the power usage of the appliance is greater than the programmed power event threshold of the appliance, the CPU is configured to calculate a percentage of the power usage of the appliance with respect to the daily threshold of the appliance and generate a push notification including the percentage; and the communications unit is further configured to transmit the push notification including the percentage to the mobile application.

The system for controlling power supplied to a plurality of appliances on a power line, wherein the real-time microcontroller is configured to: identify appliances having infrared sensors and generate power on/off commands when the power usage of the appliance is greater than the programmed power event threshold of the appliance; command the communications unit to scan for an infrared power sensor registered to one of the plurality of appliances; identify each appliance having an infrared sensor; command the communications unit to transmit the power report to the mobile application; receive a power on/off command for each appliance from a user of the mobile application when the power usage of each appliance is greater than the respective programmed power event threshold of the appliance; and power off each infrared sensor associated with each appliance for which a power off command is received.

The system for controlling power supplied to a plurality of appliances on a power line, further comprising: a message queuing telemetry transport server communicably connected with the high frequency programmable poly phase smart meter and the mobile application; a database of user credentials operatively connected to the message queuing telemetry transport server; wherein the message queuing telemetry transport server is configured to receive the encrypted certificate from the programmable poly phase smart meter, match the encrypted certificate to the user credentials; and when the encrypted certificate matches a user credential of the mobile application, permit the high frequency programmable poly phase smart meter to bi-directionally communicate with the mobile application.

The dedicated energy metering chip further comprising: an AC current sensor; an AC voltage sensor; and an isolation circuit, wherein the isolation circuit isolates the dual processor from the dedicated energy metering chip.

The dedicated energy metering chip is configured to measure voltage total harmonic distortion and current total harmonic distortion of the poly phase power measurements.

Figure 11:
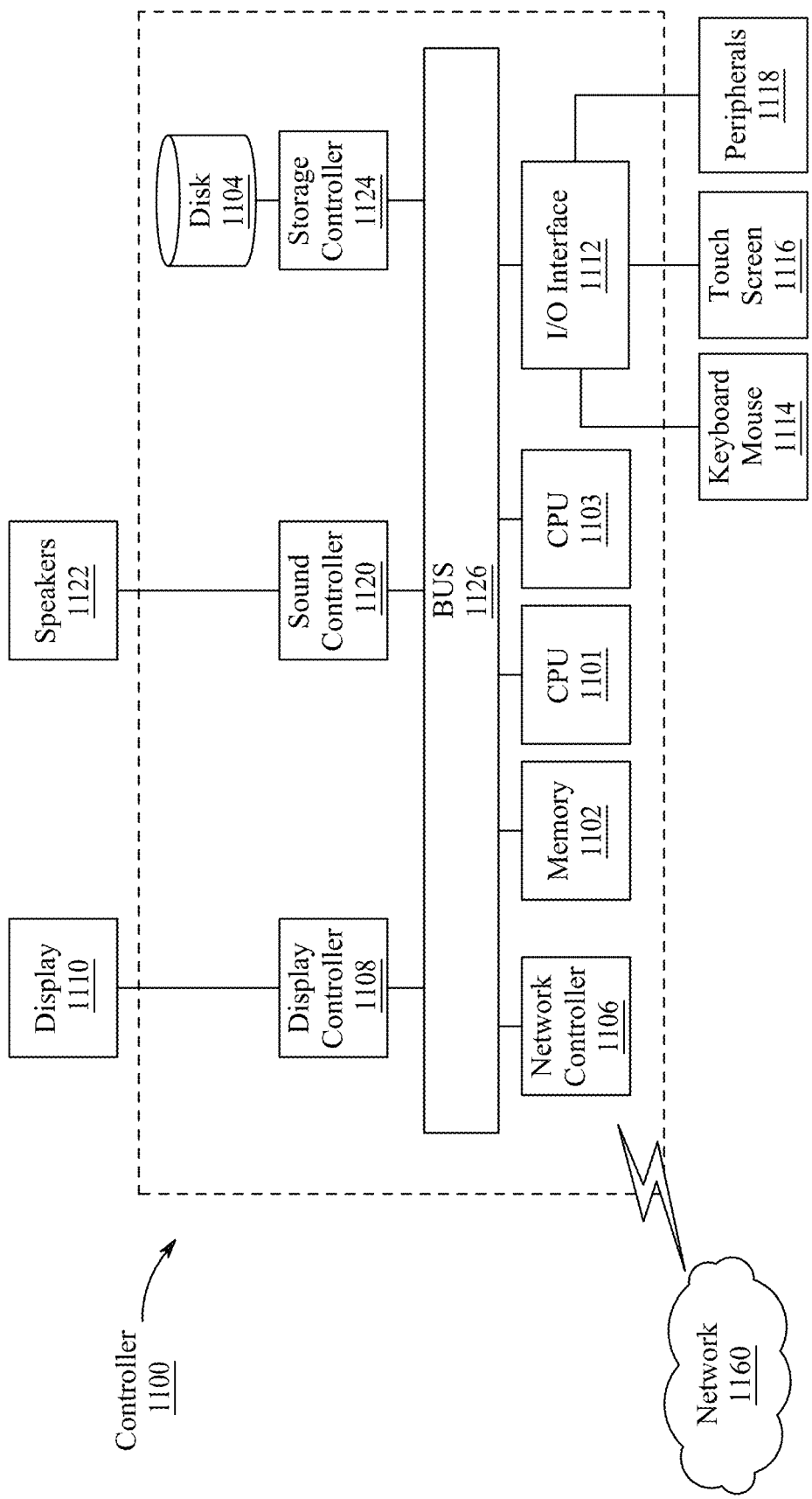
FIG. 11 is an illustration of a non-limiting example of details of computing hardware used in the computing system, according to certain embodiments.

Next, further details of the hardware description of the poly phase smart meter 100 of FIG. 1 and/or the user computing device 702 of FIGS. 7A,7B, and 7C according to exemplary embodiments is described with reference to FIG. 11. In FIG. 11, a controller 1100 is described is representative of the poly phase smart meter 100 of FIG. 1 and/or the user computing device 702 of FIGS. 7A,7B, and 7C in which the controller is a computing device which includes a CPU 1101 which performs the processes described above/below. The process data and instructions may be stored in memory 1102. These processes and instructions may also be stored on a storage medium disk 1104 such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claims may be provided as a utility application, background daemon, or component of an operating system, or combination thereof, executing in conjunction with CPU 1101, 1103 and an operating system such as Microsoft Windows 7, Microsoft Windows 10, UNIX, Solaris, LINUX, Apple MAC-OS and other systems known to those skilled in the art.

The hardware elements in order to achieve the computing device may be realized by various circuitry elements, known to those skilled in the art. For example, CPU 1101 or CPU 1103 may be a Xenon or Core processor from Intel of America or an Opteron processor from AMD of America, or may be other processor types that would be recognized by one of ordinary skill in the art. Alternatively, the CPU 1101, 1103 may be implemented on an FPGA, ASIC, PLD or using discrete logic circuits, as one of ordinary skill in the art would recognize. Further, CPU 1101, 1103 may be implemented as multiple processors cooperatively working in parallel to perform the instructions of the inventive processes described above.

The computing device in FIG. 11 also includes a network controller 1106, such as an Intel Ethernet PRO network interface card from Intel Corporation of America, for interfacing with network 1160. As can be appreciated, the network 1160 can be a public network, such as the Internet, or a private network such as an LAN or WAN network, or any combination thereof and can also include PSTN or ISDN sub-networks. The network 1160 can also be wired, such as an Ethernet network, or can be wireless such as a cellular network including EDGE, 3G and 4G wireless cellular systems. The wireless network can also be WiFi, Bluetooth, or any other wireless form of communication that is known.

The computing device further includes a display controller 1108, such as a NVIDIA GeForce GTX or Quadro graphics adaptor from NVIDIA Corporation of America for interfacing with display 1110, such as a Hewlett Packard HPL2445w LCD monitor. A general purpose I/O interface 1112 interfaces with a keyboard and/or mouse 1114 as well as a touch screen panel 1116 on or separate from display 1110. General purpose I/O interface also connects to a variety of peripherals 1118 including printers and scanners, such as an OfficeJet or DeskJet from Hewlett Packard.

A sound controller 1120 is also provided in the computing device such as Sound Blaster X-Fi Titanium from Creative, to interface with speakers/microphone 1122 thereby providing sounds and/or music.

The general purpose storage controller 1124 connects the storage medium disk 1104 with communication bus 1126, which may be an ISA, EISA, VESA, PCI, or similar, for interconnecting all of the components of the computing device. A description of the general features and functionality of the display 1110, keyboard and/or mouse 1114, as well as the display controller 1108, storage controller 1124, network controller 1106, sound controller 1120, and general purpose I/O interface 1112 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 12.

Figure 12:
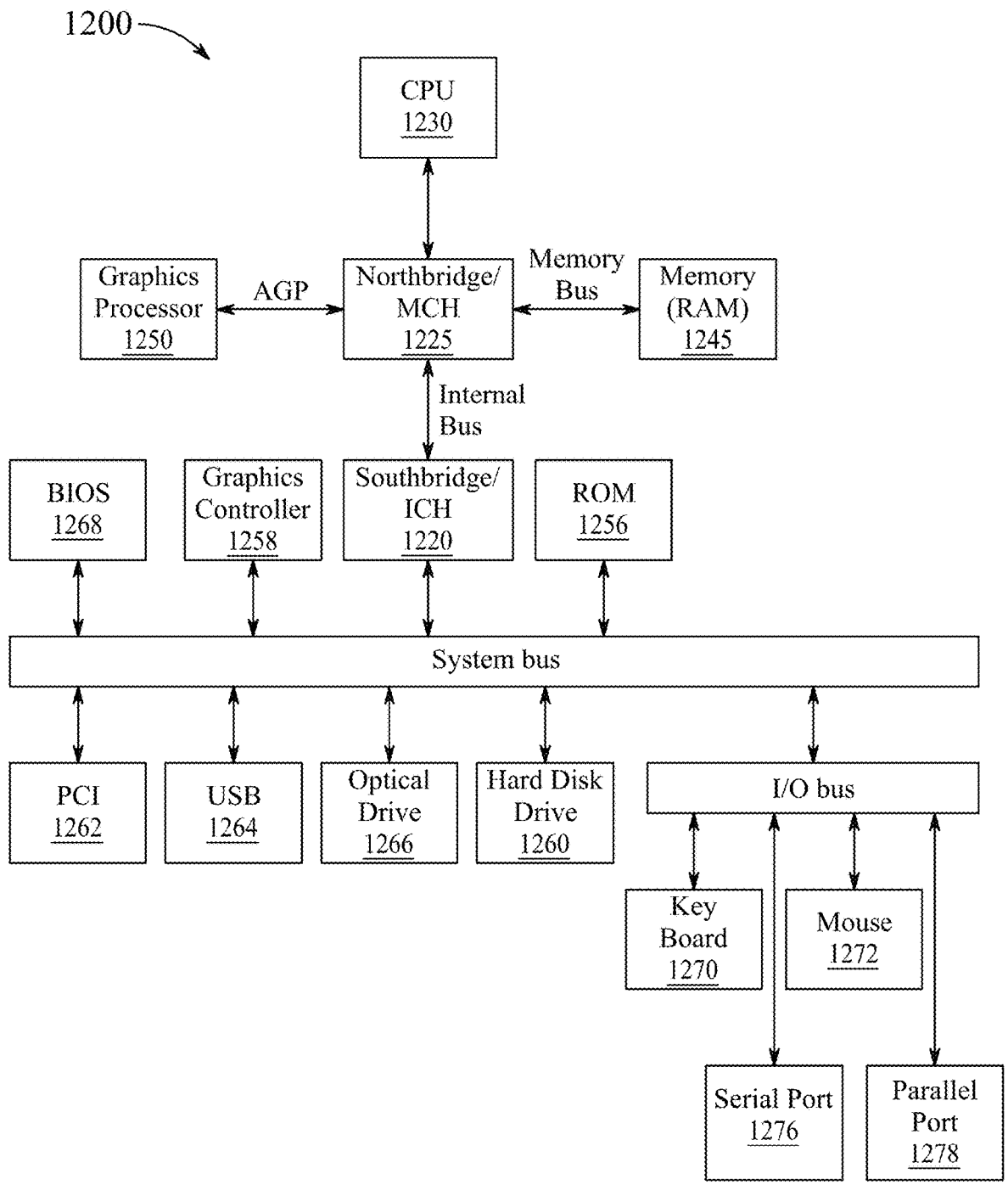
FIG. 12 is an exemplary schematic diagram of a data processing system used within the computing system, according to certain embodiments.

FIG. 12 shows a schematic diagram of a data processing system, according to certain embodiments, for performing the functions of the exemplary embodiments. The data processing system is an example of a computer in which code or instructions implementing the processes of the illustrative embodiments may be located.

In FIG. 12, data processing system 1200 employs a hub architecture including a north bridge and memory controller hub (NB/MCH) 1225 and a south bridge and input/output (I/O) controller hub (SB/ICH) 1220. The central processing unit (CPU) 1230 is connected to NB/MCH 1225. The NB/MCH 1225 also connects to the memory 1245 via a memory bus, and connects to the graphics processor 1250 via an accelerated graphics port (AGP). The NB/MCH 1225 also connects to the SB/ICH 1220 via an internal bus (e.g., a unified media interface or a direct media interface). The CPU Processing unit 1230 may contain one or more processors and even may be implemented using one or more heterogeneous processor systems.

Figure 13:
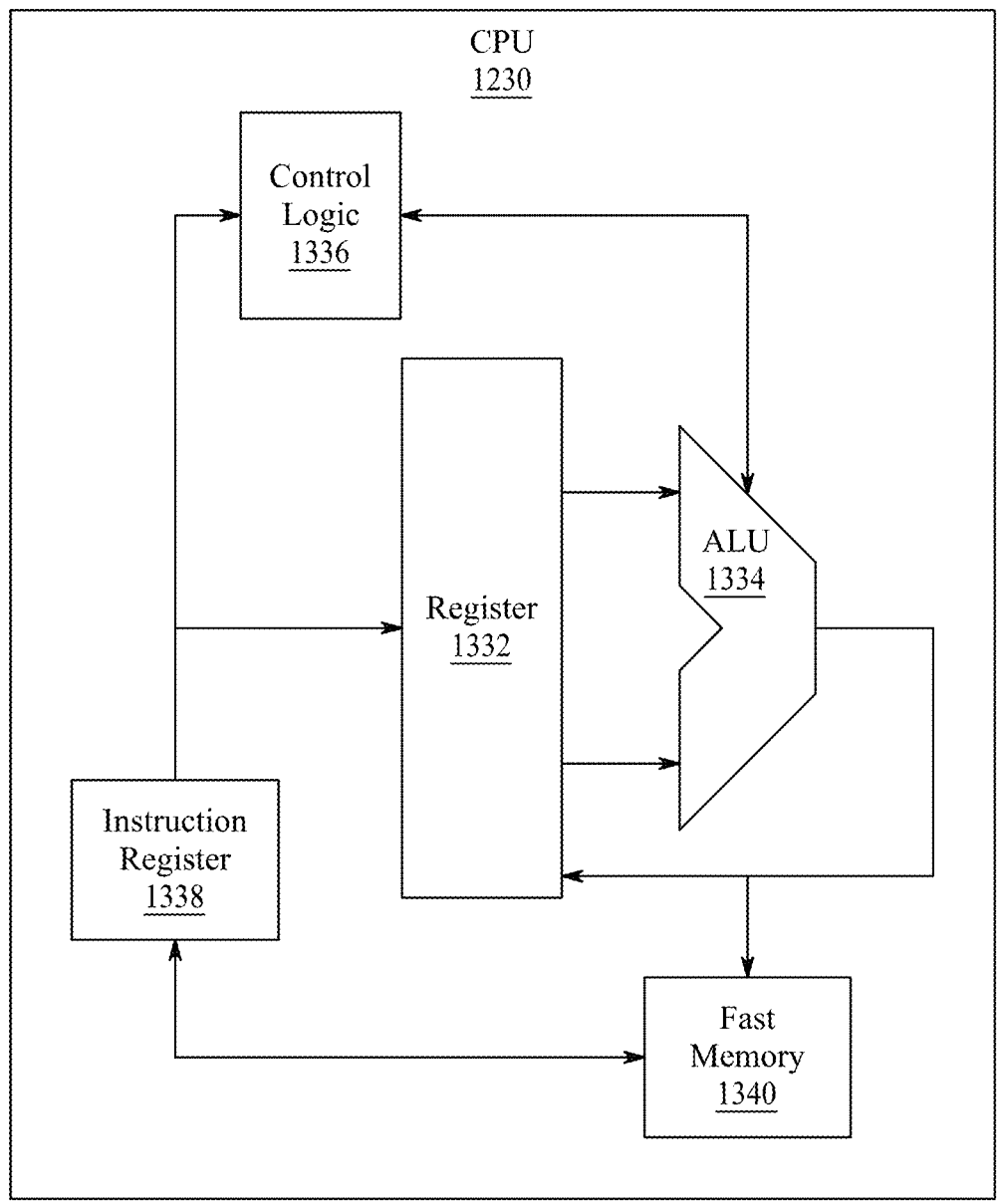
FIG. 13 is an exemplary schematic diagram of a processor used with the computing system, according to certain embodiments.

For example, FIG. 13 shows one implementation of CPU 1230. In one implementation, the instruction register 1338 retrieves instructions from the fast memory 1340. At least part of these instructions are fetched from the instruction register 1338 by the control logic 1336 and interpreted according to the instruction set architecture of the CPU 1230. Part of the instructions can also be directed to the register 1332. In one implementation the instructions are decoded according to a hardwired method, and in another implementation the instructions are decoded according a microprogram that translates instructions into sets of CPU configuration signals that are applied sequentially over multiple clock pulses. After fetching and decoding the instructions, the instructions are executed using the arithmetic logic unit (ALU) 1334 that loads values from the register 1332 and performs logical and mathematical operations on the loaded values according to the instructions. The results from these operations can be feedback into the register and/or stored in the fast memory 1340. According to certain implementations, the instruction set architecture of the CPU 1230 can use a reduced instruction set architecture, a complex instruction set architecture, a vector processor architecture, a very large instruction word architecture. Furthermore, the CPU 1230 can be based on the Von Neuman model or the Harvard model. The CPU 1230 can be a digital signal processor, an FPGA, an ASIC, a PLA, a PLD, or a CPLD. Further, the CPU 1230 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 12, the data processing system 1200 can include that the SB/ICH 1220 is coupled through a system bus to an I/O Bus, a read only memory (ROM) 1256, universal serial bus (USB) port 1264, a flash binary input/output system (BIOS) 1268, and a graphics controller 1258. PCI/PCIe devices can also be coupled to SB/ICH 1288 through a PCI bus 1262.

The PCI devices may include, for example, Ethernet adapters, add-in cards, and PC cards for notebook computers. The Hard disk drive 1260 and CD-ROM 1266 can use, for example, an integrated drive electronics (IDE) or serial advanced technology attachment (SATA) interface. In one implementation the I/O bus can include a super I/O (SIO) device.

Further, the hard disk drive (HDD) 1260 and optical drive 1266 can also be coupled to the SB/ICH 1220 through a system bus. In one implementation, a keyboard 1270, a mouse 1272, a parallel port 1278, and a serial port 1276 can be connected to the system bus through the I/O bus. Other peripherals and devices that can be connected to the SB/ICH 1220 using a mass storage controller such as SATA or PATA, an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

Figure 14:
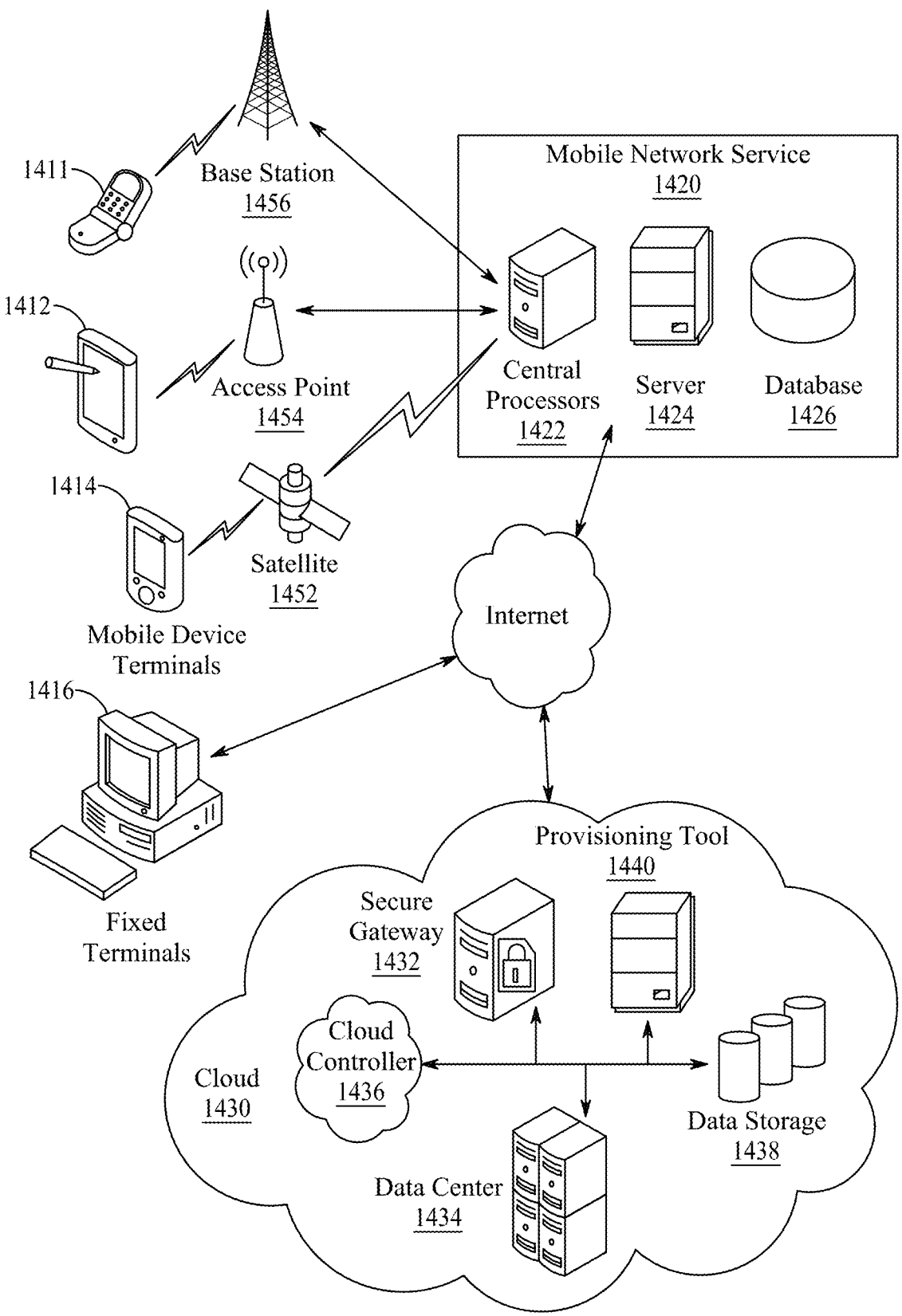
FIG. 14 is an illustration of a non-limiting example of distributed components which may share processing with the controller, according to certain embodiments.

The functions and features described herein may also be executed by various distributed components of a system. For example, one or more processors may execute these system functions, wherein the processors are distributed across multiple components communicating in a network. The distributed components may include one or more client and server machines, which may share processing, as shown by FIG. 14, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

The above-described hardware description is a non-limiting example of corresponding structure for performing the functionality described herein.

Obviously, numerous modifications and variations of the present disclosure are possible in light of the above teachings. It is therefore to be understood that within the scope of the appended claims, the invention may be practiced otherwise than as specifically described herein.

The invention claimed is:

1. A high frequency programmable poly phase smart meter for a plurality of appliances, comprising:
    a set of clamps configured to surround a power line which supplies power to the plurality of appliances;
    a dedicated energy metering chip connected to receive power from the set of clamps and collect poly phase power measurements from the power line, the dedicated energy metering chip including:
    an analog to digital converter, ADC, the ADC configured to sample the poly phase power measurements at frequencies in the range of 0 kilo samples per second to 32 kilo samples per second, and convert the poly phase power measurements to digital power measurements; and
    a serial interface configured to connect the dedicated energy metering chip with a dual processor;
    the dual processor including:
    a real-time microcontroller connected to the dedicated energy metering chip via the serial interface to receive the digital power measurements;
    a computer processing unit, CPU, connected to the real-time microcontroller, the CPU including circuitry and one or more processors having program instructions configured to analyze the poly phase power measurements in real time, disaggregate the poly phase power measurements, and generate a power report regarding a power usage of each appliance; and
    a memory shared by the real-time microcontroller and the CPU; and
    a communications unit connected to the real-time microcontroller, wherein the communications unit is configured to transmit the power report,
    wherein the power report includes one or more of voltage total harmonic distortion on the power line, current total harmonic distortion on the power line, a power usage graph depicting power usage of each appliance, an alert when power usage of an appliance is not within a predetermined range, a status of each appliance, an energy rating for each appliance, and an energy cost of each appliance.

2. The high frequency poly phase smart meter of claim 1, wherein:

the CPU is further configured to compare a power usage of an appliance to a programmed power event threshold of the appliance;

when the power usage of the appliance is greater than the programmed power event threshold of the appliance, the CPU is configured to calculate a percentage of the power usage of the appliance with respect to the programmed power event threshold of the appliance and generate a push notification including the percentage; and the communications unit is further configured to transmit the push notification including the percentage.

3. The high frequency poly phase smart meter of claim 2, wherein the real-time microcontroller is configured to identify appliances having infrared sensors and generate power on/off commands to the infrared sensor when the power usage of the appliance is greater than the programmed power event threshold of the appliance.

4. The high frequency poly phase smart meter of claim 1, wherein the dedicated energy metering chip is configured to measure voltage total harmonic distortion and current total harmonic distortion of the poly phase power measurements.

5. The high frequency poly phase smart meter of claim 1, wherein the dedicated energy metering chip includes:
an AC current sensor;
an AC voltage sensor; and
an isolation circuit, wherein the isolation circuit is configured to isolate the dual processor from the dedicated energy metering chip.

6. The high frequency poly phase smart meter of claim 1, wherein the CPU is configured to disaggregate the poly phase power measurements based on a non-intrusive load monitoring calculation included in the program instructions.

7. A method for controlling power by a high frequency programmable poly phase smart meter of a plurality of appliances on a power line, comprising:

collecting, by a dedicated energy metering chip, poly phase power measurements from the power line;

sampling, by an analog to digital converter, the poly phase power measurements at frequencies in the range of 0 kilo samples per second to 32 kilo samples per second and converting the poly phase power measurements to digital power measurements;

transmitting, by a serial port interface, SPI, the digital power measurements over a serial communications interface;

receiving, by a real-time microcontroller, the digital power measurements from the SPI;

storing, in a memory, the digital power measurements;

accessing, by a computer processing unit, CPU, the digital power measurements from the memory;

analyzing, by the CPU, the CPU including circuitry and one or more processors having program instructions, the poly phase power measurements in real time, disaggregating the poly phase power measurements, and generating a power report regarding a power usage of each appliance;

transmitting, by a communications unit, the power report, communicably connecting, by the communications unit, the high frequency programmable poly phase smart meter to a mobile application;

registering the high frequency programmable poly phase smart meter with the mobile application by generating an encrypted certificate and storing the encrypted certificate in the memory;

sending, by the communications unit, the power report to the mobile application;

receiving, by the communications unit, power on/off commands for each appliance from the mobile application; and powering each appliance on/off based on the power on/off commands.

8. The method of claim 7, further comprising:
measuring, by the dedicated energy metering chip, voltage total harmonic distortion and current total harmonic distortion of the poly phase power measurement.

9. The method of claim 7, further comprising:
disaggregating the poly phase power measurements based on a non-intrusive load monitoring calculation included in the program instructions.

10. The method of claim 7, further comprising:
connecting, by the communications unit, the high frequency programmable poly phase smart meter to the mobile application through a message queuing telemetry transport server storing user credentials, exchanging the encrypted certificate with the message queuing telemetry transport server;

matching the encrypted certification to a database of user credentials stored by the message queuing telemetry transport server; and when the encrypted certificate matches a user credential of the mobile application, permitting the high frequency programmable poly phase smart meter to bi-directionally communicate with the mobile application.

11. The method of claim 7, further comprising:
receiving, by the communications unit, a power event threshold for each appliance from the mobile application;

storing each power event threshold in the memory;

comparing an individual power usage of each appliance to its respective power event threshold;

when the individual power usage of the appliance is greater than its respective power event threshold, calculating, by the CPU, a percentage of the power usage of the appliance with respect to the daily threshold of the appliance;

generating, by the CPU, a push notification including the percentage; and transmitting, by the communications unit, the push notification including the percentage to the mobile application.

12. The method of claim 7, further comprising:
scanning, by the communications unit, for an infrared power sensor registered to one of the plurality of appliances;

identifying, by the real-time microcontroller, each appliance having an infrared sensor; and generating, by a user of the mobile application, power on/off commands when the power usage of each appliance is greater than the respective programmed power event threshold of the appliance.

13. A system for controlling power supplied to a plurality of appliances on a power line, comprising:

a dedicated energy metering chip configured to collect poly phase power measurements from the power line, the dedicated energy metering chip including:

an analog to digital converter, ADC, the ADC configured to sample the poly phase power measurements at frequencies in the range of 0 kilo samples per second to 32 kilo samples per second, and convert the poly phase power measurements to digital power measurements; and a serial interface to connect the dedicated energy metering chip with a dual processor, the serial interface configured to transmit the poly phase measurements;

a dual processor including:

a real-time microcontroller connected to the dedicated energy metering chip via the serial interface to receive the digital power measurements;

a computer processing unit, CPU, connected to the real-time microcontroller, the CPU including circuitry and one or more processors having program instructions configured to analyze the poly phase power measurements in real time, disaggregate the poly phase power measurements, and generate a power report regarding a power usage of each appliance;

a memory shared by the real-time microcontroller and the CPU, the memory configured to store the digital power measurements;

a mobile application registered with a high frequency programmable poly phase smart meter; and a communications unit connected to the real-time microcontroller, the communications unit configured to transmit the power report to the mobile application, receive power on/off commands for each appliance from the mobile application and power each appliance on/off based on the power on/off commands, wherein:

the CPU is further configured to compare a power usage of an appliance to a programmed power event threshold of the appliance;

when the power usage of the appliance is greater than the programmed power event threshold of the appliance, the CPU is configured to calculate a percentage of the power usage of the appliance with respect to the daily threshold of the appliance and generate a push notification including the percentage; and the communications unit is further configured to transmit the push notification including the percentage to the mobile application.

14. The system of claim 13, wherein the real-time microcontroller is configured to:

identify appliances having infrared sensors and generate power on/off commands when the power usage of the appliance is greater than the programmed power event threshold of the appliance;

command the communications unit to scan for an infrared power sensor registered to one of the plurality of appliances;

identify each appliance having an infrared sensor;

command the communications unit to transmit the power report to the mobile application;

receive a power on/off command for each appliance from a user of the mobile application when the power usage of each appliance is greater than the respective programmed power event threshold of the appliance; and power off each infrared sensor associated with each appliance for which a power off command is received.

15. The system of claim 13, further comprising:

a message queuing telemetry transport server communicably connected with the high frequency programmable poly phase smart meter and the mobile application;

a database of user credentials operatively connected to the message queuing telemetry transport server;

wherein the message queuing telemetry transport server is configured to receive the encrypted certificate from the programmable poly phase smart meter, match the encrypted certificate to the user credentials; and when the encrypted certificate matches a user credential of the mobile application, permit the high frequency programmable poly phase smart meter to bi-directionally communicate with the mobile application.

16. The system of claim 13, the dedicated energy metering chip further comprising:

an AC current sensor;

an AC voltage sensor; and an isolation circuit, wherein the isolation circuit isolates the dual processor from the dedicated energy metering chip.

17. The system of claim 13, wherein the dedicated energy metering chip is configured to measure voltage total harmonic distortion and current total harmonic distortion of the poly phase power measurements.

* * * * *

UNITED STATES PATENT AND TRADEMARK OFFICE
CERTIFICATE OF CORRECTION

PATENT NO. : 11,320,467 B1  
APPLICATION NO. : 17/411508  
DATED : May 3, 2022  
INVENTOR(S) : Abdulah Jeza Aljohani et al.

It is certified that error appears in the above-identified patent and that said Letters Patent is hereby corrected as shown below:

In the Specification

Column 1, after Title of the Invention (Line 3), insert:
--STATEMENT OF ACKNOWLEDGEMENT
The inventors extend their appreciation to the Deputyship for Research and Innovation, Ministry of Education in Saudi Arabia for funding this research work through the project number 2021-013 and King Abdulaziz University, DSR, Jeddah, Saudi Arabia.--

Signed and Sealed this
Eighteenth Day of June, 2024

Katherine Kelly Vidal
*Director of the United States Patent and Trademark Office*